(12) United States Patent
Kuriyama

(10) Patent No.: US 7,470,965 B2
(45) Date of Patent: Dec. 30, 2008

(54) SOLID-STATE IMAGING DEVICE

(75) Inventor: Toshihiro Kuriyama, Otsu (JP)

(73) Assignee: Panasonic Corporation, Osaka (JP)

( * ) Notice: Subject to any disclaimer, the term of this patent is extended or adjusted under 35 U.S.C. 154(b) by 90 days.

(21) Appl. No.: 10/893,931

(22) Filed: Jul. 20, 2004

(65) Prior Publication Data
US 2005/0056901 A1    Mar. 17, 2005

(30) Foreign Application Priority Data
Sep. 11, 2003    (JP)    ............... 2003-320227

(51) Int. Cl.
*H01L 31/10* (2006.01)
(52) U.S. Cl. .......... 257/443; 257/E31.11; 257/E31.121; 257/E31.127; 438/69; 438/70; 438/78
(58) Field of Classification Search ......... 257/443–447, 257/E31.11, E31.121, E31.127; 438/66, 438/69, 70, 73, 78
See application file for complete search history.

(56) References Cited

U.S. PATENT DOCUMENTS

| | | | |
|---|---|---|---|
| 4,708,436 A * | 11/1987 | Kleinknecht ................ 359/575 |
| 5,625,232 A | 4/1997 | Numata et al. |
| 5,633,527 A * | 5/1997 | Lear ............................ 257/432 |
| 5,892,540 A * | 4/1999 | Kozlowski et al. .......... 348/300 |
| 6,008,511 A * | 12/1999 | Tokumitsu et al. .......... 257/232 |
| 6,188,119 B1 | 2/2001 | Ogawa et al. |
| 6,246,081 B1 | 6/2001 | Abe |
| 6,312,969 B1 | 11/2001 | Abe |
| 6,344,666 B1 * | 2/2002 | Yamaguchi et al. ............ 257/98 |
| 6,690,049 B2 * | 2/2004 | Suzuki et al. ................ 257/294 |

(Continued)

FOREIGN PATENT DOCUMENTS

CN    1190803 A    8/1998

(Continued)

OTHER PUBLICATIONS

Chinese Office Action issued in corresponding Chinese Patent Application No. CN 2004100682153, dated Oct. 19, 2007.

(Continued)

*Primary Examiner*—Lex Malsawma
*Assistant Examiner*—William F Kraig
(74) *Attorney, Agent, or Firm*—McDermott Will & Emery LLP

(57) ABSTRACT

In a solid-state imaging device of the present invention, light-sensitive elements 54, each of which includes a light receiving section capable of receiving light, are arranged in a matrix form at regular spacings in a photoreceiving region provided on a semiconductor substrate 51. A plurality of detecting electrodes 53 are provided on the semiconductor substrate 51 corresponding to the light-sensitive elements 54 for detecting an electrical charge generated by each light-sensitive element 54. A plurality of interconnections 57 coat the detecting electrodes 53, and apply a voltage thereto. A plurality of reflecting walls 62 are formed in a grid pattern over the interconnection 57 so as to partition the light-sensitive elements 54 individually for reflecting a portion of light entering the semiconductor substrate 51 from above onto the light receiving section of each light-sensitive element 54. The plurality of reflecting walls 62 are electrically insulated from the interconnections 57.

8 Claims, 23 Drawing Sheets

U.S. PATENT DOCUMENTS

| | | | |
|---|---|---|---|
| 6,717,228 B2 * | 4/2004 | Ando et al. | 257/443 |
| 6,995,800 B2 * | 2/2006 | Takahashi et al. | 348/340 |
| 7,068,432 B2 * | 6/2006 | Boettiger et al. | 359/619 |
| 2001/0039061 A1 * | 11/2001 | Suzuki et al. | 438/1 |

FOREIGN PATENT DOCUMENTS

| | | | |
|---|---|---|---|
| JP | 59-182949 | * | 12/1984 |
| JP | 01213079 A | * | 8/1989 |
| JP | 06-163863 | * | 6/1994 |
| JP | 6-169079 | | 6/1994 |
| JP | 07-045805 | * | 2/1995 |
| JP | 9-331055 | | 12/1997 |
| JP | 10-223881 | | 8/1998 |
| JP | 10-229180 | | 8/1998 |
| JP | 10229180 | * | 8/1998 |
| JP | 11-040787 | * | 2/1999 |
| JP | 11-087674 | | 3/1999 |
| JP | 2000-340783 | * | 12/2000 |
| JP | 2001-077339 | | 3/2001 |
| JP | 2002-359363 | * | 12/2002 |

OTHER PUBLICATIONS

Japanese Notice of Reasons for Rejection issued in Japanese Patent Application No. 2005-306388 dated on Sep. 9, 2008 no translation.*

* cited by examiner

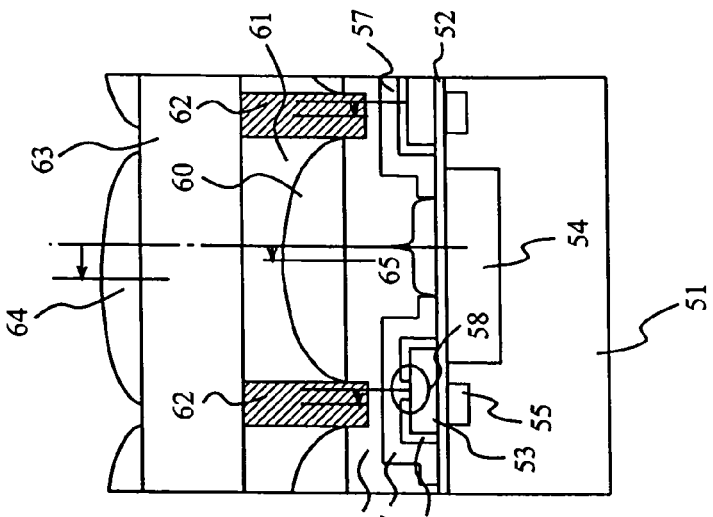
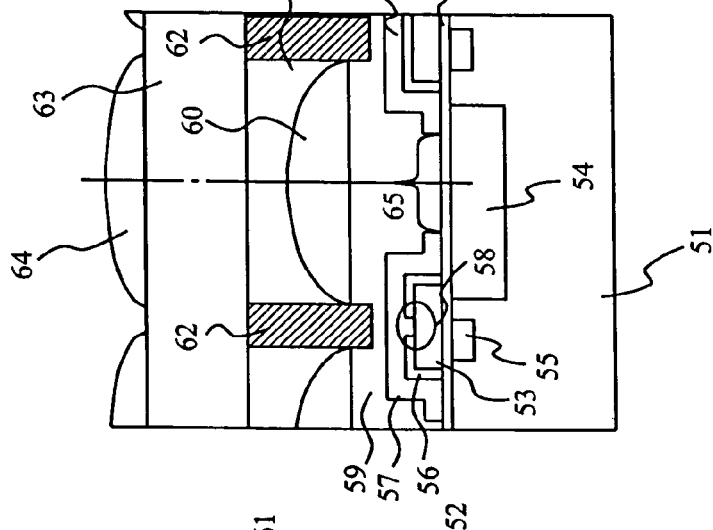
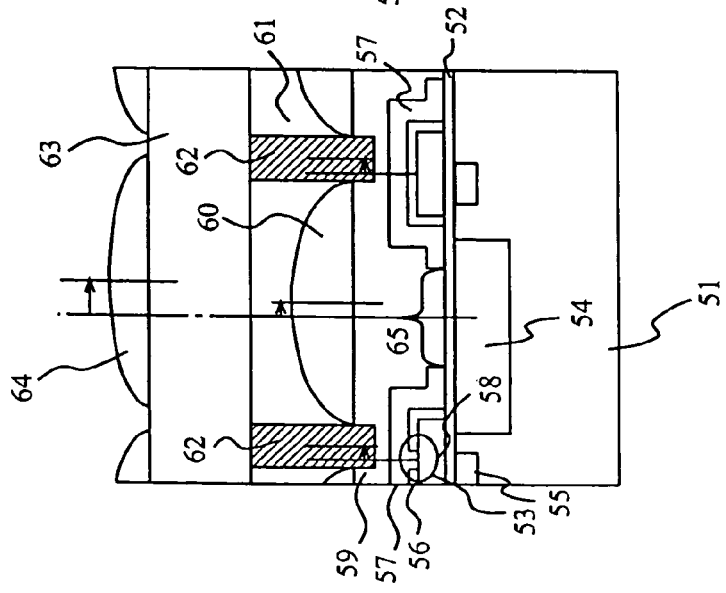

SOLID-STATE IMAGING DEVICE

BACKGROUND OF THE INVENTION

1. Field of the Invention

The present invention relates to a solid-state imaging device. More particularly, the present invention relates to a solid-state imaging device in which a plurality of light-sensitive elements are arranged in a matrix form.

2. Description of the Background Art

There exists a solid-state imaging device, which is typified by a CCD, having a reflecting wall as shown in FIG. 16 in order to efficiently collect oblique light incident from above onto a light-sensitive element. Hereinafter, with reference to FIG. 16, the above-described solid-state imaging device will be described.

The solid-state imaging device as shown in FIG. 16 includes a semiconductor substrate 501, a gate insulating film 502, a gate electrode 503, a photodiode 504, a charge transfer section 505, an interlayer insulating film 506, a light-shielding film 507, an insulating film 509, an intralayer lens 510, a planarization film 511, a reflecting wall 512, a color filter 513, and an on-chip micro lens 514.

The photodiode 504 and the charge transfer section 505 are formed on the semiconductor substrate 501. A surface of the semiconductor substrate 501 is coated with the gate insulating film 502, and the gate electrode 503 is formed on the gate insulating film 502. The interlayer insulating film 506 is formed on the gate electrode 503. Further, the light-shielding film 507 is formed so as to coat the gate insulating film 502 and the interlayer insulating film 506. Note that there is an aperture 515 on the photodiode 504 so that light is received by the photodiode 504.

Also, the insulting film 509 is formed on the light-shielding film 507. The intralayer lens 510 and the planarization film 511 are formed on the insulating film 509. Also, a metal reflecting wall 512 is formed on the light-shielding film 507 so as to partition the pixels individually. Further, the color filter 513 is formed on the planarization film 511. The on-chip micro lens 514 is formed on the color filter 513 for each photodiode 504.

Here, the reflecting wall 512 will be described in detail with reference to FIG. 17. FIG. 17 is an illustration of a solid-state imaging device, in which the semiconductor substrate 501 is viewed from above. FIG. 16 shows a cross section of FIG. 17 at X-X'. Note that FIG. 17 shows only the gate electrode 503, the light-shielding film 507, the reflecting wall 512, and the aperture 515. Also, for the sake of simplification, assume that the solid-state imaging device shown in FIG. 17 has a 6×4 matrix arrangement.

As shown in FIG. 17, each aperture 515 is surrounded by the reflecting walls 512, which are formed on the light-shielding film 507 in a grid pattern. As such, in the conventional solid-state imaging device, the reflecting walls 512 are formed on the light-shielding film 507 so as to surround the pixel. Thus, as shown in FIG. 16, it is possible to collect oblique light incident from above onto the aperture 515. As a result, light sensitivity of the solid-state imaging device is improved (Japanese Laid-Open Patent Publication No. 2001-77339).

In the above-described conventional solid-state imaging device, however, a voltage applied to the gate electrode 503 located at the center of a photoreceiving region including the photodiodes 504 arranged in a matrix form is reduced, which results in a delay in an operation of the gate electrode 503. Hereinafter, with reference to FIG. 17, the above-described problem will be described in detail.

When a voltage is applied to the gate electrode 503, a voltage needs to be applied to a portion of the gate electrode 503 (an encircled portion in FIG. 17) lying off the edge of the photoreceiving region, in which the photodiodes 504 are arranged in a matrix form, since the gate electrode 503 is coated with the light-shielding film 507, or a lens lies above the gate electrode 503, for example, in the photoreceiving region.

The gate electrode 503 is made of polysilicon having a relatively high resistance. Thus, if a voltage is applied only to the edge of the gate electrode 503 as shown in FIG. 17, the applied voltage is reduced in the gate electrode 503 (e.g., the gate electrode located at the center of the photoreceiving region) positioned away from a point to which the voltage is applied. As a result, an operation performed by the gate electrode 503 for detecting a signal charge may be delayed, or a potential required for transferring the detected signal charge may not be generated, for example.

In order to solve the above-described operational delay, there exist solid-state imaging devices disclosed in Japanese Laid-Open Patent Publication No. H6-169079 and Japanese Laid-Open Patent Publication No. H9-331055. Hereinafter, such a solid-state imaging device will be described with reference to the drawings. FIG. 18 is an illustration showing a cross section view of the conventional solid-state imaging device. Also, FIG. 19 is an illustration of the conventional solid-state imaging device, in which the semiconductor substrate 501 is viewed from above. FIG. 18 shows a cross section of FIG. 19 at Y-Y'.

The solid-state imaging device shown in FIG. 18 differs from the solid-state imaging device shown in FIG. 16 in that a contact 508 for connecting the light-shielding film 507 and the gate electrode 503 is formed. As shown in FIG. 19, such contacts 508 are formed at equal spacings across the photoreceiving region of the solid-state imaging device. The solid-state imaging device as shown in FIG. 18 also differs from the solid-state imaging device as shown in FIG. 16 in that the light-shielding film 507 doubles as an interconnection. As for the above-structured solid-state imaging device as shown in FIG. 18, the application of a voltage to the gate electrode 503 will be described below.

First, in FIG. 19, a voltage to be applied to the gate electrode 503 is applied to an upper or a lower end of the light-shielding film 507. When a voltage is applied to the light-shielding film 507, the voltage is then applied to the gate electrode 503 via the contact 508. As a result, the gate electrode 503 is able to detect a signal charge generated by the photodiode 504.

Here, the above-described light-shielding film 507 is made of a metal such as W (tungsten). A value of resistance of a metal such as W is smaller than a value of resistance of polysilicon. Thus, even if a voltage is applied to an upper or lower end of the light-shielding film 507, the voltage is not substantially reduced in the central part of the light-shielding film 507. That is, a voltage of substantially the same level is applied to each contact 508, and a voltage of substantially the same level is applied to each gate electrode 503. As a result, it is possible to eliminate a delay in an operation performed by the gate electrode 503.

However, the problem is that the reflecting wall 512 as shown in FIG. 16 cannot be formed in the solid-state imaging device as shown in FIG. 18. Hereinafter, the above-described problem will be described in detail.

As shown in FIG. 16, the reflecting wall 512 is formed so as to come into contact with the light-shielding film 507. On the other hand, in the solid-state imaging device as shown in FIG. 18, the light-shielding film 507 doubles as an interconnection for applying a voltage to the gate electrode 503. As a result, in the solid-state imaging device as shown in FIG. 18, if the grid-shaped reflecting wall 512 as shown in FIG. 17 is formed so as to come into contact with the light-shielding film 507, the light-shielding films 507 are electrically connected to each other. That is, all gate electrodes 503 are electrically connected to each other. As a result, the solid-state imaging device is not able to operate properly.

SUMMARY OF THE INVENTION

Therefore, an object of the present invention is to provide a solid-state imaging device capable of preventing oblique light from entering a photodiode while preventing a delay in an operation performed by a gate electrode.

The present invention has the following features to attain the object mentioned above.

In a solid-state imaging device according to the present invention, a plurality of light-sensitive elements, each of which includes a light receiving section capable of receiving light, are arranged in a matrix format regular spacings in a photoreceiving region provided on a semiconductor substrate. A plurality of detecting electrodes are provided on the semiconductor substrate corresponding to the plurality of light-sensitive elements for detecting an electrical charge generated by each light-sensitive element. A plurality of interconnections coat the plurality of detecting electrodes, and apply a voltage to the plurality of detecting electrodes. A plurality of reflecting walls, which are formed in a grid pattern over the interconnection so as to partition the light-sensitive elements individually, for reflecting a portion of light entering the semiconductor substrate from above onto the light receiving section of each light-sensitive element. The plurality of reflecting walls are electrically insulated from the plurality of interconnections.

Note that an insulating film may be formed between a lower surface of the plurality of reflecting walls and an upper surface of the plurality of interconnections.

Preferably, the plurality of reflecting walls are formed so that a middle point of the reflecting walls opposing each other across the light-sensitive element is displaced from the center of the light receiving section toward the center of the photoreceiving region, and the amount of the displacement between the middle point of the reflecting walls opposing each other across the light-sensitive element and the center of the light receiving section of the light-sensitive element depends on the distance from the center of the photoreceiving region to the center of the light receiving section. Preferably, the greater the distance from the center of the photoreceiving region becomes, the greater the amount of the displacement between a middle point of the reflecting walls opposing each other across the light-sensitive element and the center of the light receiving section of the light-sensitive element becomes.

Also, a vertical cross section of the reflecting wall may be a trapezoid whose upper base is longer than the lower base.

Also, a plurality of intralayer lenses, each of which is placed over the corresponding light-sensitive element in an area surrounded by the plurality of reflecting walls, for collecting light onto the light-sensitive element may be further included. In this case, the center of each of the plurality of intralayer lenses is preferably displaced from the center of the light receiving section of the light-sensitive element toward the center of the photoreceiving region by an amount depending on the distance from the center of the photoreceiving region to the center of the light receiving section.

Also, a color filter formed on the plurality of reflecting walls, and a plurality of micro lenses, each of which is formed on the color filter corresponding to each of the light-sensitive elements, may be further included. In this case, the center of each of the plurality of micro lenses is preferably displaced from the center of the light receiving section of the light-sensitive element toward the center of the photoreceiving region by an amount depending on the distance from the center of the photoreceiving region to the center of the light receiving section.

The present invention is also directed to a manufacturing method of a solid-state imaging device. Specifically, the manufacturing method of the solid-state imaging device according to the present invention includes the steps of: forming a plurality of light-sensitive elements, each of which includes a light receiving section capable of receiving light, in a matrix form at regular spacings in a photoreceiving region provided on a semiconductor substrate; forming a plurality of detecting electrodes so as to correspond to the plurality of light-sensitive elements for detecting a signal charge generated by each light-sensitive element; forming an interlayer insulating film coating the detecting electrode; forming a contact through the interlayer insulating film; forming a plurality of metal interconnections coating the plurality of detecting electrodes such that the metal interconnections are connected with the plurality of detecting electrodes via the contact; depositing an insulating film on the plurality of metal interconnections and the plurality of light-sensitive elements; forming a mask with a grid pattern on the insulating film; forming a grid-shaped trench for partitioning the light-sensitive elements individually over the interconnection by using the mask with a grid pattern and by removing the insulating film lying under a grid opening of the mask by etching; depositing a metal inside the grid-shaped trench; and forming a color filter so as to coat the trench, inside which the metal is deposited, and the insulating film. In the step of removing the insulating film by etching, the grid-shaped trench is formed so as to leave a portion of the insulating film on the interconnection.

Also, in the step of depositing the insulating film, a first insulating film having a first etching rate may be deposited, and a second insulating film, which has an etching rate higher than the first etching rate, may be deposited on the first insulating film.

Preferably, the mask with a grid pattern is formed so that a middle point of the grid openings opposing each other across the light-sensitive element in the interconnection is displaced from the center of the light receiving section of the light-sensitive element toward the center of the photoreceiving region, and the amount of the displacement between the middle point of the grid openings opposing each other across the light-sensitive element in the metal interconnection and the center of the light receiving section of the light-sensitive element depends on the distance from the center of the photoreceiving region to the center of the light receiving section.

Also, another manufacturing method of the solid-state imaging device according to the present invention includes the steps of: forming a plurality of light-sensitive elements, each of which includes a light receiving section capable of receiving light, in a matrix form at regular spacings in a photoreceiving region provided on a semiconductor substrate; forming a plurality of detecting electrodes so as to correspond to the plurality of light-sensitive elements for detecting a signal charge generated by each light-sensitive element; forming an interlayer insulating film coating the detecting electrode; forming a contact through the interlayer insulating film; forming a metal interconnection coating the plurality of detecting electrodes such that the metal interconnection is connected with the plurality of detecting electrodes via the contact; depositing an insulating film on the metal interconnection and the plurality of light-sensitive elements; forming a mask with grid pattern on the insulating film; forming a grid-shaped trench for partitioning the light-sensitive elements individually over the interconnection by using the mask with a grid pattern and by removing the insulating film lying under a grid opening of the mask by etching; forming an optically transparent insulating film coating a side wall and a bottom surface of the trench; depositing a metal inside the trench coated by the optically transparent insulating film; and forming a color filter so as to coat the trench, inside which the metal is deposited, and the insulating film.

Based on the solid-state imaging device according to the present invention, a reflecting wall is formed. Thus, it is possible to prevent oblique light from entering an adjacent pixel, and efficiently collect the oblique light onto a light-sensitive element. Also, it is possible to apply a voltage to a detecting electrode using an interconnection, whereby it is possible to prevent a delay in an operation performed by the detecting electrode Further, the interconnection and the reflecting wall are insulated from each other, whereby the solid-state imaging device is able to operate normally, as it will be described below.

In general, the detecting electrode is made of polysilicon having a relatively high resistance. Also, in the solid-state imaging device, a voltage to drive the detecting electrode is applied to the edge of the detecting electrode. As a result, the applied voltage is reduced in a central area of the detecting electrode, thereby delaying the operation of the detecting electrode.

However, as described above, a voltage is applied to the detecting electrode using the interconnection, whereby it is possible to prevent the voltage from being reduced in the central area of the detecting electrode. Thus, it is possible to prevent a delay in the operation performed by the detecting electrode.

In the solid-state imaging device according to the present invention, the reflecting wall is displaced toward the center of the photoreceiving region, whereby it is possible to reduce a difference in the light sensitivity between the central area of the photoreceiving region and its peripheral area.

Also, in the solid-state imaging device according to the present invention, the greater the distance from the center of the photoreceiving region becomes, the greater the amount of the displacement of the reflecting walls becomes. Here, a pixel closer to the edge of the photoreceiving region receives more oblique light. Thus, it is possible to effectively reduce a difference in the light sensitivity between the central area of the photoreceiving region and its peripheral area by increasing the amount of the displacement of the reflecting walls by an amount depending on the distance from the center of the photoreceiving region to the center of the reflecting wall.

Also, a cross section of the reflecting wall is a trapezoid whose upper base is longer than the lower base, whereby it is possible to cause the oblique light to be reflected toward the light receiving section of the light-sensitive element more efficiently. As a result, it is possible to efficiently collect the light onto the light-sensitive element.

Also, the intralayer lens allows the light to be efficiently collected on to the light-sensitive element. Further, the center of the intralayer lens is displaced from the center of the aperture toward the center of the photoreceiving region, whereby it is possible to efficiently collect the oblique light onto the light-sensitive element.

Also, the on-chip micro lens allows the light to be efficiently collected onto the light-sensitive element. Further, the center of the on-chip micro lens is displaced from the center of the aperture toward the center of the photoreceiving region, whereby it is possible to efficiently collect the oblique light onto the light-sensitive element.

The present invention is directed not only to the solid-state imaging device but also to the manufacturing method of the solid-state imaging device. Based on the manufacturing method of the solid-state imaging device, it is possible to manufacture the solid-state imaging device of the present invention.

Note that, after deposition of the first insulating film having the first etching rate, the second insulating film having an etching rate higher than the first etching rate is deposited on the first insulating film. Thus, the above-described difference in the etching rate allows the formation speed of the trench to slow down when the trench used for forming the reflecting wall is formed. As a result, it is possible to form a trench which does not reach the interconnection without performing precise processing time control.

Also, the insulating film is formed around the reflecting wall, whereby the reflecting wall and the interconnection are not electrically connected even if a trench reaching the interconnection is formed. Thus, it is not necessary to pay attention to a depth of the trench during the formation of the trench. As a result, it is possible to form a trench which does not reach the interconnection without performing precise processing time control.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 11A to 11C are cross section views of the solid-state imaging device according to the fourth embodiment of the present invention;

DESCRIPTION OF THE PREFERRED EMBODIMENTS

First Embodiment

Figure 1:
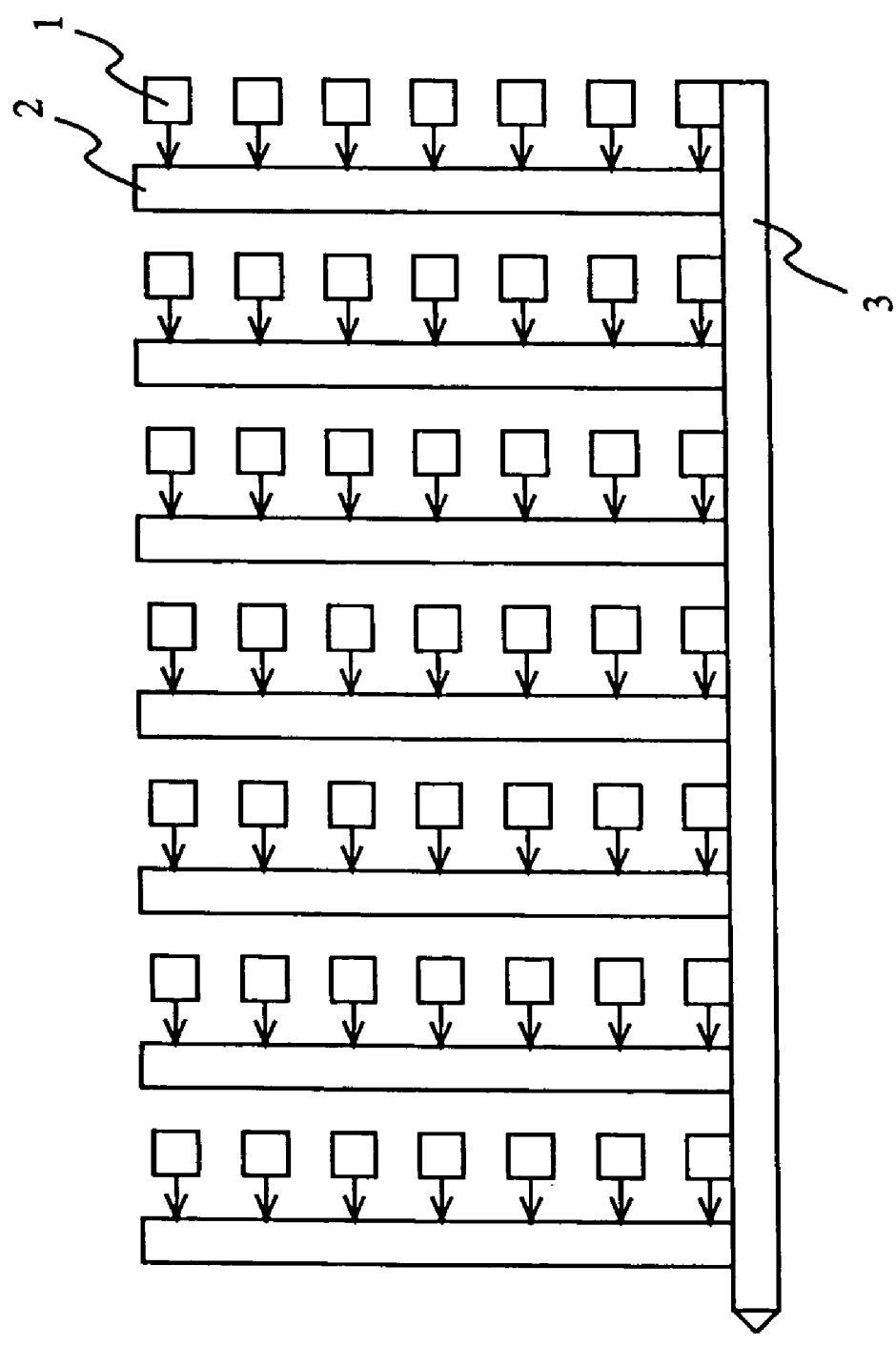
FIG. 1 is an illustration showing a structure of the entirety of a solid-state imaging device according to a first embodiment of the present invention.
Figure 2:
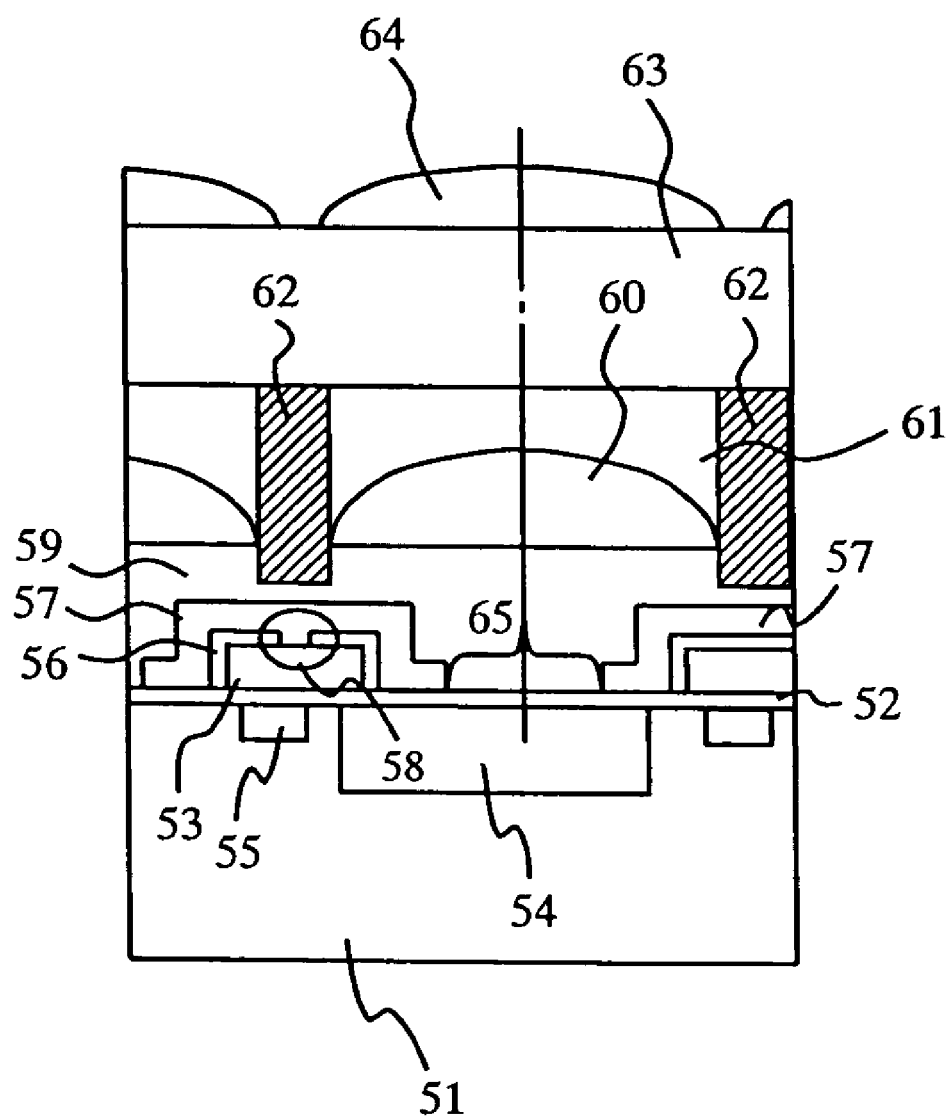
FIG. 2 is a cross section view of the solid-state imaging device according to the first embodiment of the present invention.

Hereinafter, with reference to the drawings, a solid-state imaging device according to a first embodiment of the present embodiment will be described. Here, FIG. 1 is an illustration showing a structure of the entirety of the solid-state imaging device according to the first embodiment. FIG. 2 is a cross section view of the solid-state imaging device shown in FIG. 1.

As shown in FIG. 1, the solid-state imaging device according to the present embodiment includes a light receiving section 1, a vertical CCD shift resistor 2, and a horizontal CCD shift resistor 3.

As shown in FIG. 1, the light receiving sections 1, each of which includes a light-sensitive element such as a photodiode, are arranged in a matrix form at regular spacings in a rectangular photoreceiving region. The light receiving section 1 generates a signal charge whose electrical charges are proportional to the intensity of light incident from outside. The vertical CCD shift resistor 2 is placed between lines, each of which is composed of a plurality of light-sensitive elements 1, in a longitudinal direction. The CCD shift resistor 2 transfers a signal charge generated by each light receiving section 1 in a vertical direction of FIG. 1. The horizontal CCD resistor 3 transfers a signal charge transferred from the vertical CCD shift resistor 2 in a horizontal direction, thereby transferring the signal charge to the outside.

Next, a cross section of a pixel of the solid-state imaging device shown in FIG. 1 will be described by using FIG. 2. As shown in FIG. 2, a pixel of the solid-state imaging device according to the present embodiment includes a semiconductor substrate 51, a gate insulating film 52, a gate electrode 53, a photodiode 54, a charge transfer section 55, an interlayer insulating film 56, a light-shielding film 57, a contact 58, an insulating film 59, an intralayer lens 60, a planarization film 61, a reflecting wall 62, a color filter 63, and an on-chip micro lens 64.

A plurality of photodiodes 54 are formed in a matrix form at regular spacings on the semiconductor substrate 51. Note that the photodiode 54 generates a signal charge whose electrical charges are proportional to the intensity of light incident from above (i.e., an upper portion of FIG. 2). Further, the charge transfer section 55 is formed on the left side of the photodiode 54 so as to be away therefrom. The charge transfer section 55 is included in the horizontal CCD shift resistor 3.

The gate insulating film 52, which is a silicon oxide film, is formed on the semiconductor substrate 51. Also, on the gate insulating film 52, the polysilicon gate electrode 53 is formed immediately above the charge transfer section 55. The gate electrode 53 detects a signal charge generated by the photodiode 54, and outputs the detected signal charge to the charge transfer section 55. Also, the interlayer insulating film 56, which is a silicon oxide film, is formed so as to coat the gate electrode 53. Further, the light-shielding film 57 is formed so as to coat the interlayer insulating film 56. The light-shielding film 57, which prevents light from entering the gate electrode 53, is made of W (tungsten), for example. Note that an aperture 65 is formed on the photodiode 54, thereby allowing light to pass through the aperture 65 to the photodiode 54. The apertures 65 are formed in a matrix form at regular spacings immediately above the respective photodiodes 54.

Also, the light-shielding film 57 and the gate electrode 53 are connected to each other via the contact 58. The light-shielding film 57 according to the present embodiment doubles as an interconnection used for applying a voltage to a detecting electrode.

The insulating film 59 is formed on the light-shielding film 57 and the aperture 65. The insulating film 59 is optically transparent, and is formed as a BPSG film, for example, which is deposited by a CVD method. In an area above the aperture 65, the intralayer lens 60 is formed on the insulating film 59 for collecting light incident from above onto the photodiode 54. Further, the planarization film 61, which is a silicon oxide film, is formed on the intralayer lens 60 and the insulating film 59. The planarization film 61 is optically transparent, and has a refractive index lower than that of the intralayer lens 60.

Figure 3:
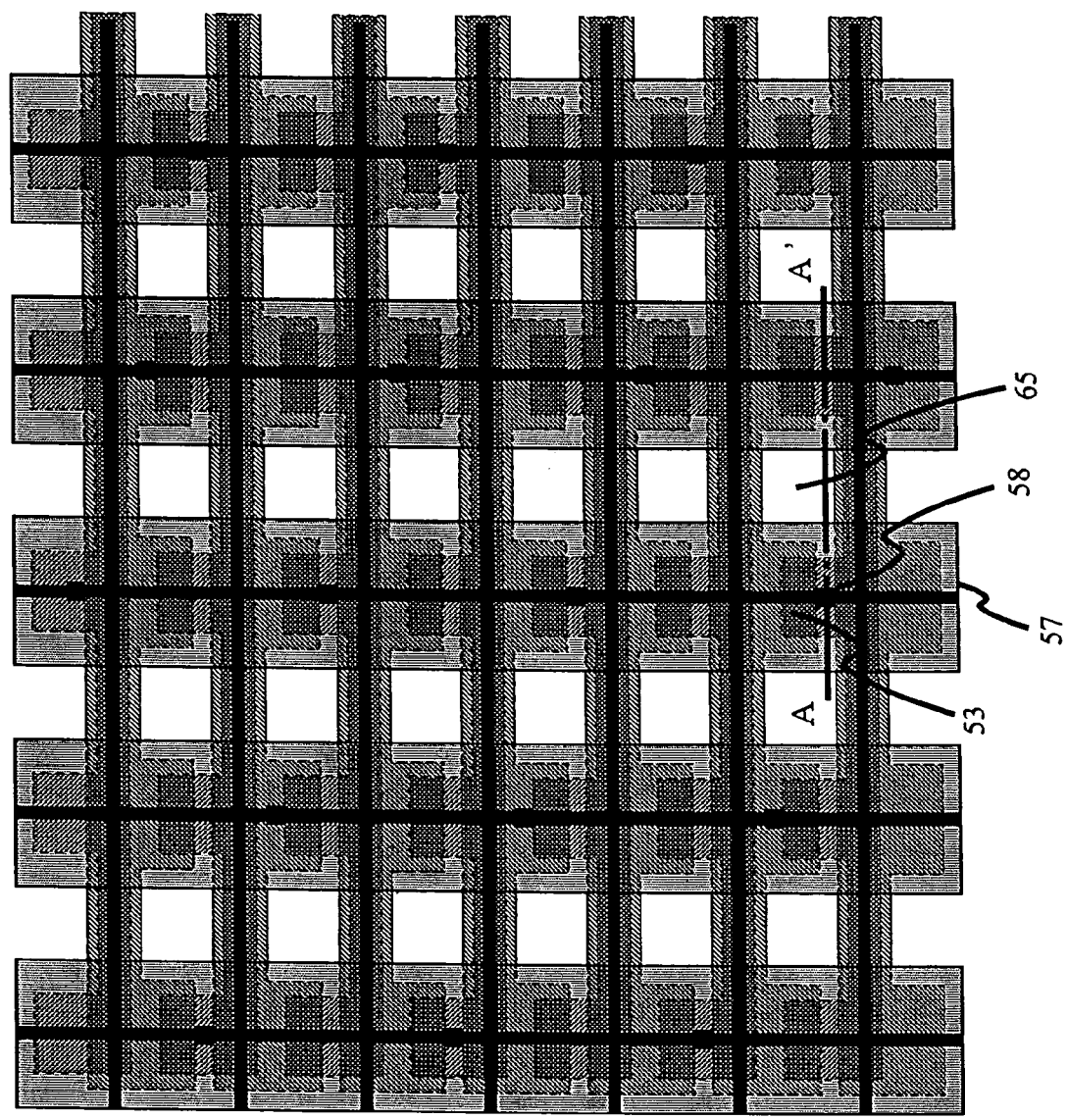
FIG. 3 is a top plan view of the solid-state imaging device according to the first embodiment of the present invention.

Also, the metal (e.g., W and Ti (titanium)) reflecting wall 62 is formed inside the planarization film 61 and the insulating film 59 so as to have no contact with the light-shielding film 57. The reflecting wall 62 reflects a portion of light (specifically, oblique light) incident from above upon the aperture 65. Here, with reference to FIG. 3, the placement of the reflecting wall 62, which is one feature of the present embodiment, will be described. Here, FIG. 3 is an illustration of the solid-state imaging device of the present embodiment, in which the semiconductor substrate 51 is viewed from above. Note that, in FIG. 3, only the gate electrode 53, the light-shielding film 57, the contact 58, and the aperture 65 are shown. Also, FIG. 2 shows a cross section of FIG. 3 at A-A'.

As shown in FIG. 3, the light-shielding film 57 is formed in a grid pattern when the semiconductor substrate 51 is viewed from above. Each aperture 65 is surrounded by the gate electrode 53 and the light-shielding film 57. With such a configuration, the solid-state imaging device according to the present embodiment collects oblique light onto the aperture 65.

With reference to the drawings, a manufacturing method of the above-described solid-state imaging device will be described below. FIGS. 4 to 7 are cross section views of the solid-state imaging device at each step of a manufacturing process described in the present embodiment.

Figure 4A:
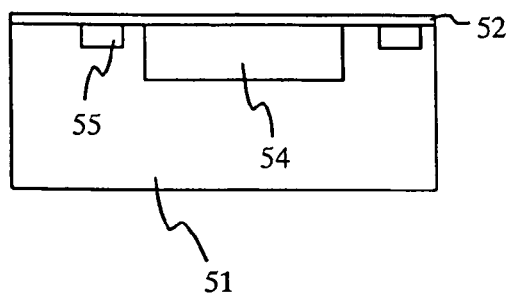
FIGS. 4A to 4M are cross section views of the solid-state imaging device at each step of a manufacturing process described in the first embodiment of the present invention.

First, the photodiode 54 is formed on the semiconductor substrate 51 so that a plurality of the photodiodes 54 are arranged in a matrix form at regular spacings. Further, the charge transfer section 55 corresponding to the above-described photodiode 54 is formed next to the photodiode 54 so as to be away therefrom. Then, the gate insulating film 52, which is a silicon oxide film, is formed on the semiconductor substrate 51 by a CVD method. As a result, the solid-state imaging device has a structure whose cross section is as shown in FIG. 4A.

Figure 4B:
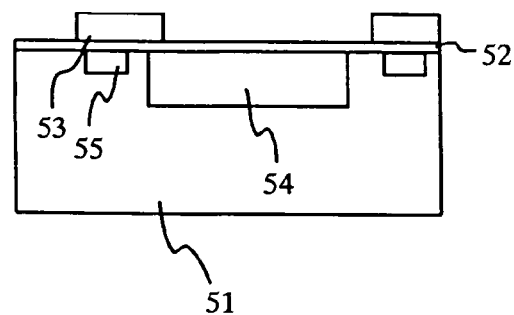

Next, as shown in FIG. 4B, on the gate insulating film 52, the polysilicon gate electrode 53 is formed immediately above the charge transfer section 55. Specifically, after a polysilicon film is deposited by a CVD method, the polysilicon film in a predetermined area is selectively removed by dry etching, whereby the gate electrode 53 is formed.

After the gate electrode 53 is formed, the interlayer insulating film 56, which is a silicon oxide film, is formed so as to coat the gate electrode 53.

Figure 4C:
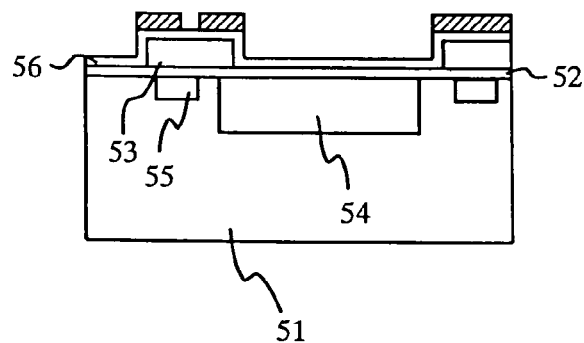

After the interlayer insulating film 56 is formed, as shown in FIG. 4C, a resist is formed on the interlayer insulating film 56. The resist has an open area in a position in which the contact 58 of the interlayer insulating film 56 should be formed.

Figure 4D:
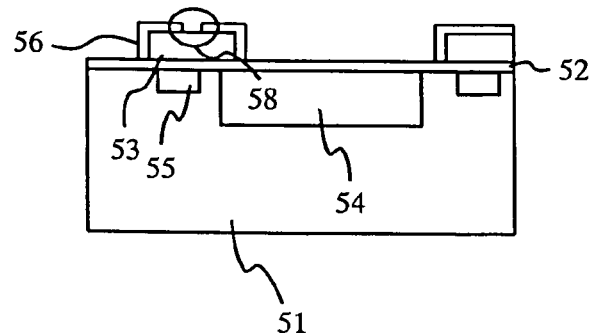

After formation of the resist is completed, a dry etching is performed using the resist as a mask, thereby removing a portion of the interlayer insulating film 56. Then, a resist is removed by ashing, etc. As a result, as shown in FIG. 4D, a contact hole used as the contact 58 is formed. Note that CxFy gas, for example, is used as reactive gas for dry etching.

Figure 4E:
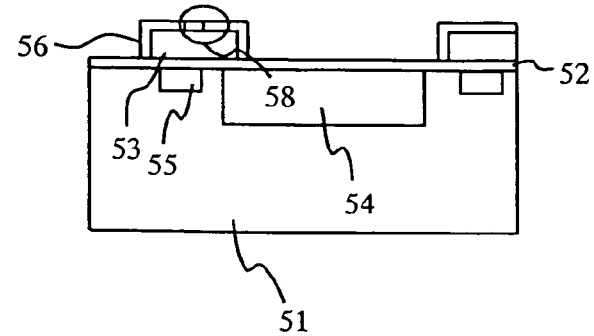

Next, as shown in FIG. 4E, a metal (e.g., W) is deposited on the inside of the contact hole formed in FIG. 4D. Specifically, a W thin film is deposited on the contact hole and the interlayer insulating film 56 by a CVD method, and the excess W lying off the contact hole is removed by wet etching, etc. Thus, formation of the contact 58 is completed.

Figure 4F:
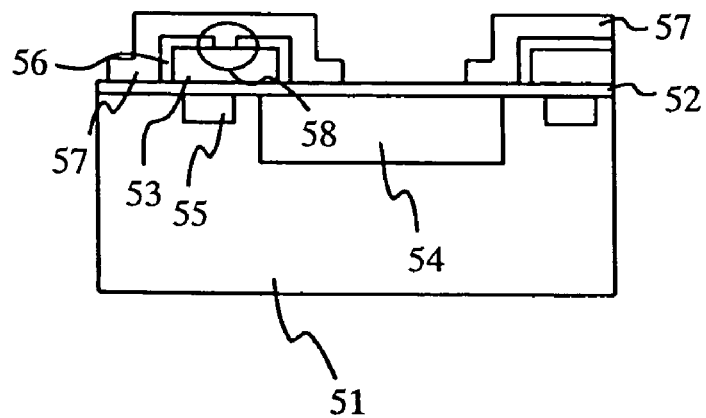

After formation of the contact 58 is completed, the light-shielding film 57 is formed so as to coat the interlayer insulating film 56. Specifically, a W thin film is formed by a PVD method or a CVD method so as to coat the interlayer insulating film 56 and the gate insulating film 52. Then, the W thin film coating the photodiode 54 is selectively removed by dry etching. As a result, the contact 58 is formed, and the aperture 65 is formed at the same time. At this time, the solid-state imaging device has a structure whose cross section is as shown in FIG. 4F.

Figure 4G:
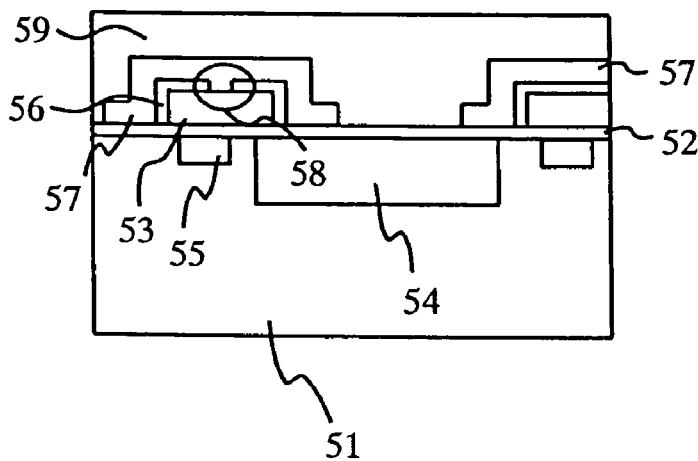

Next, a BPSG film is deposited on the light-shielding film 57 and the aperture 65 by a CVD method. Then, the BPSG film is reflowed by heating, whereby its surface is planarized. As a result, the insulating film 59 is formed, and the solid-state imaging device has a structure whose cross section is as shown in FIG. 4G.

Figure 4H:
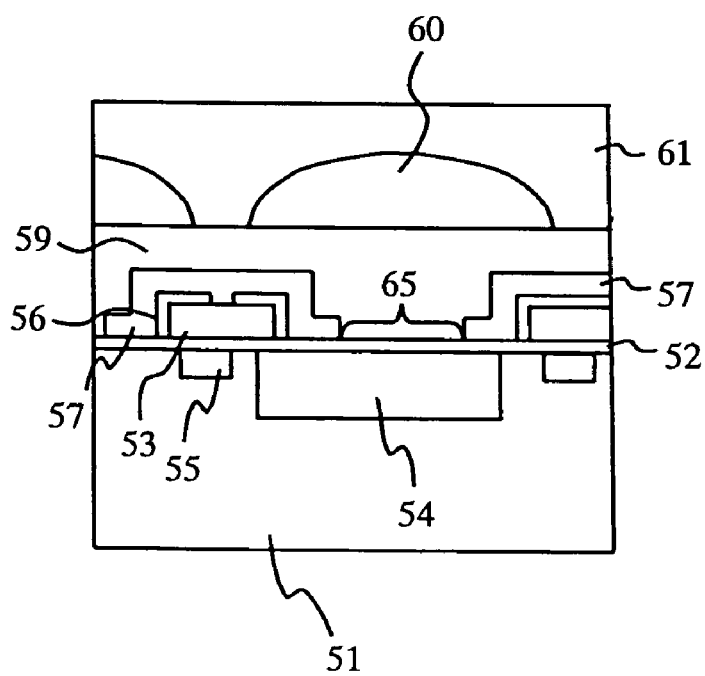

After formation of the insulating film 59, the silicon nitride intralayer lens 60 is formed on the insulating film 59 in an area over the aperture 65. Further, a silicon oxide film is deposited on the intralayer lens 60 by a CVD method. Then, a surface of the silicon oxide film is planarized by a CMP method, thereby forming the planarization film 61. As a result, the solid-state imaging device has a structure whose cross section is as shown in FIG. 4H.

Figure 4I:
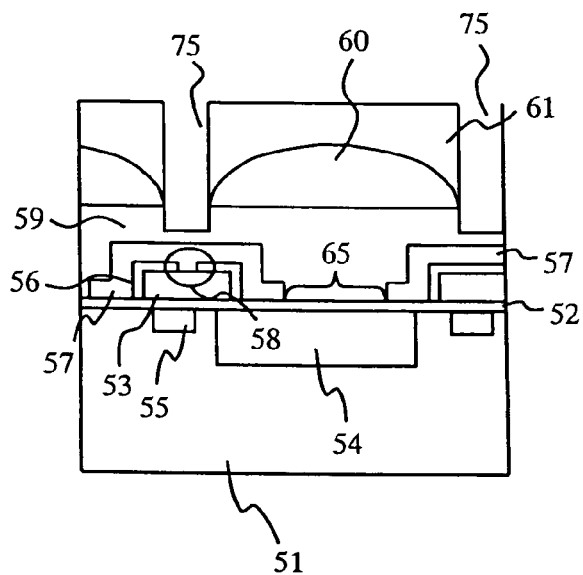

Next, a resist film with a grid pattern is formed on the planarization film 61 such that a trench, which will be described below, is formed between the apertures 65. Then, dry etching using CxFy gas is performed, thereby selectively removing the planarization film 61 and the insulating film 59 lying under the grid opening of the mask. As a result, as shown in FIG. 4I, a trench 75 is formed. Note that an etching condition such as a processing time, etc., is controlled so that the bottom of the trench 75 does not reach the light-shielding film 57. Also, the trench 75 is formed so that its width is no more than 1 µm.

Figure 4J:
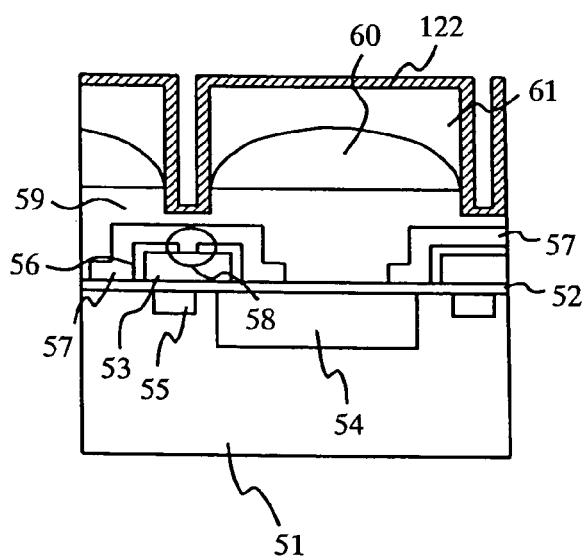
Figure 4K:
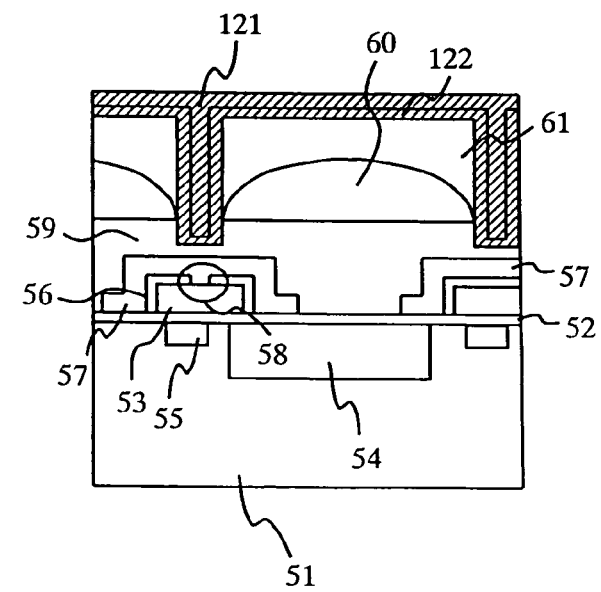
Figure 4L:
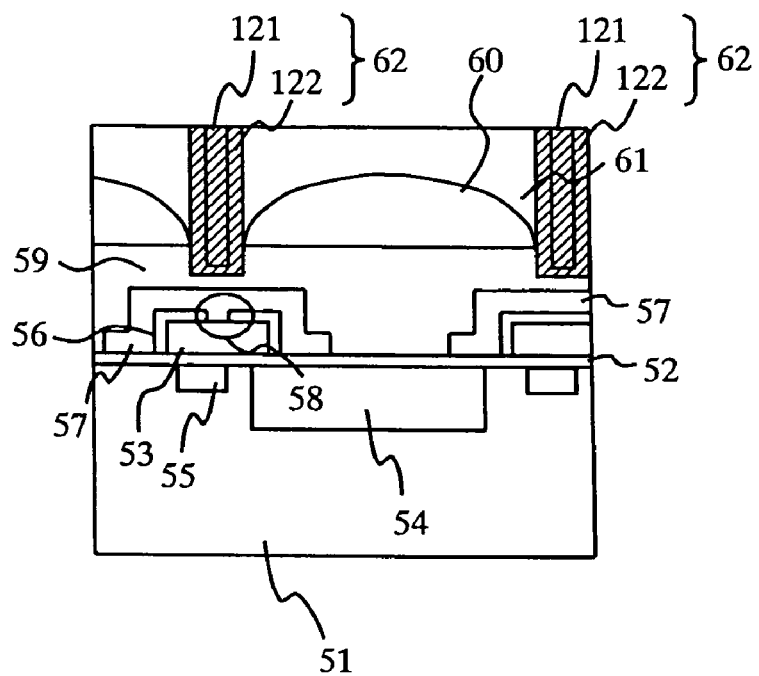

After formation of the trench 75, as shown in FIG. 4J, a Ti film 122 is formed by a PVD method. Then, as shown in FIG. 4K, a W film 121 is formed on the Ti film 122 by a CVD method. After formation of the Ti film 122 and the W film 121 is completed, the excess Ti film 122 and the excess W film 121 lying off the trench 75 are removed by a CMP method or an etch back process. As a result, as shown in FIG. 4L, the reflecting wall 62 is formed.

Figure 4M:
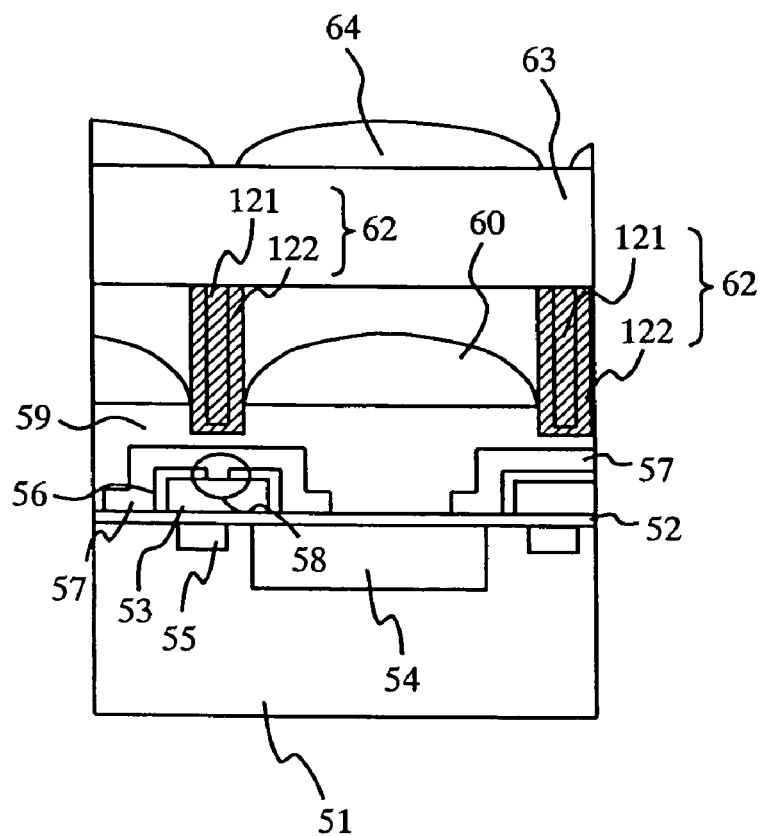

After formation of the reflecting wall 62 is completed, the color filter 63 is formed on the reflecting wall 62 and the planarization film 61. Specifically, a three-or four-layer film is deposited according to color coding by a dyeing method or color resist coating. Finally, the on-chip micro lens 64 is formed on the color filter 63. Specifically, the color filter 63 is coated with a hot-melt transparent resin, and a thermal reflow process is performed for a resist on the hot-melt transparent resin to form the on-chip micro lens 64. As a result, the solid-state imaging device having the structure as shown in FIG. 4M is completed.

As such, based on the solid-state imaging device according to the present invention, it is possible to prevent a delay in an operation performed by the gate electrode, as it will be described below.

In the conventional solid-state imaging device, a voltage is applied to the gate insulating film lying off the edge of the photoreceiving region in which the light-sensitive elements are arranged in a matrix form. The gate electrode is made of polysilicon having a relatively high resistance. Thus, the voltage is reduced in a location away from a point to which the voltage is applied. Such a reduction in voltage causes a delay in an operation performed by the gate electrode for detecting a signal charge from the photodiode.

On the other hand, in the solid-state imaging device according to the present embodiment, the light-shielding film and the gate electrode are connected to each other via a contact formed across the photoreceiving region at regular spacings, whereby a voltage is applied to the gate electrode by applying a voltage to the light-shielding film.

The light-shielding film is made of a metal whose resistance is lower than polysilicon, which is used as a material of the gate electrode. Thus, even if a voltage is applied to a portion lying off the edge of the photoreceiving region of the light-shielding film, the voltage is not substantially reduced at the center of the light-shielding film. As a result, it is possible to prevent a delay in an operation performed by the gate electrode.

Also, based on the solid-state imaging device according to the present embodiment, the light-shielding film is formed so as to surround the aperture, whereby it is possible to efficiently collect oblique light onto the aperture. Also, the light-shielding film and the reflecting wall are formed so as not to come into contact with each other, whereby the light-shielding films are not electrically connected to each other. That is, based on the solid-state imaging device according to the present embodiment, the gate electrode does not malfunction.

Second Embodiment

Figure 5:
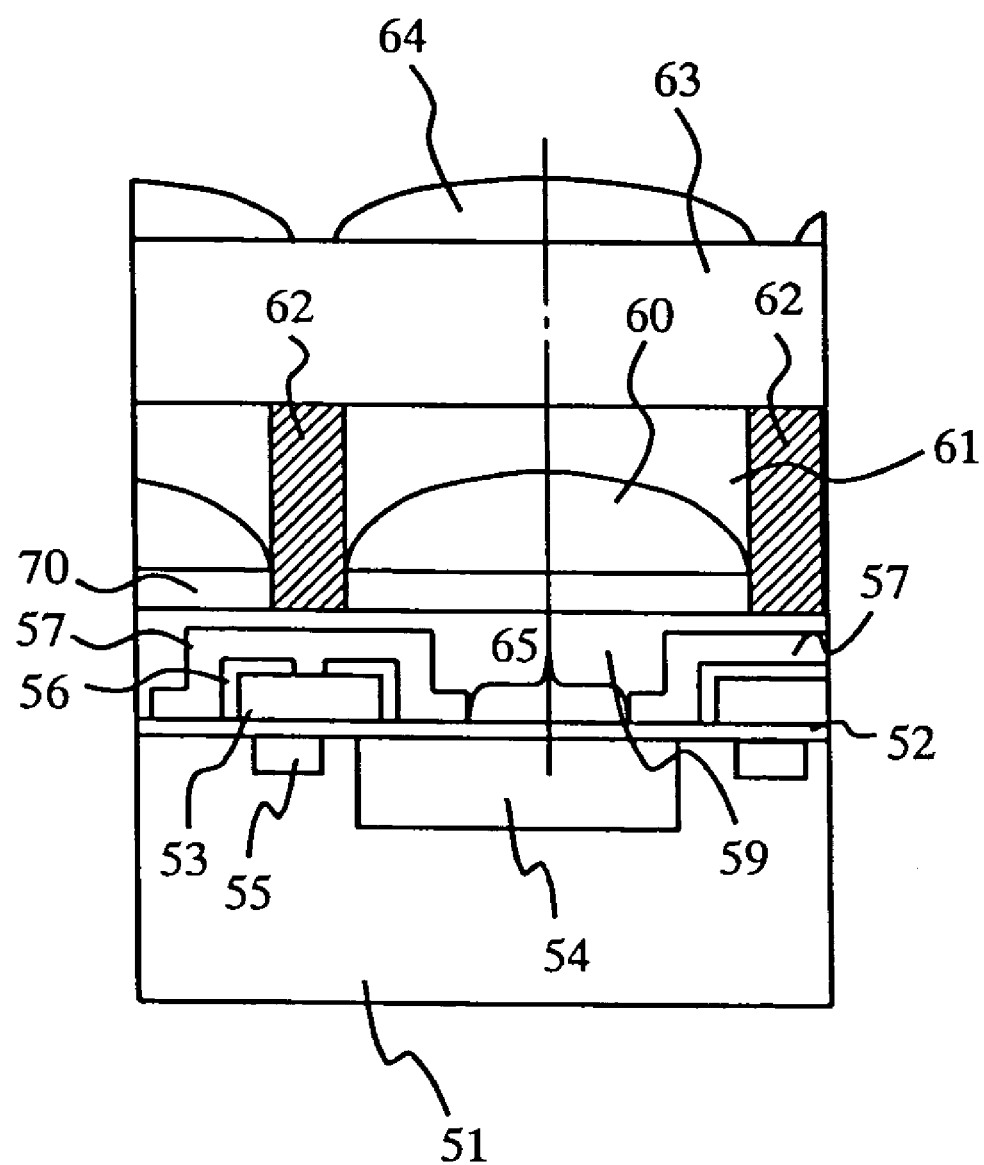
FIG. 5 is across section view of one pixel of a solid-state imaging device according to a second embodiment of the present invention.

Hereinafter, a second embodiment of the present invention will be described with reference to the drawings. A solid-state imaging device according to the present embodiment differs from the solid-state imaging device according to the first embodiment in that an insulating film 70, whose etching rate is different from that of the insulating film 59 of the solid-state imaging device according to the first embodiment, is formed on the insulating film 59. The first embodiment and the second embodiment are identical except for the insulating film 70. FIG. 5 is a cross section view of one pixel of the solid-state imaging device according to the present embodiment.

First, a structure of the entirety of the solid-state imaging device according to the present embodiment is shown in FIG. 1, as is the case with the first embodiment, and therefore any detailed descriptions thereof will be omitted.

A pixel of the solid-state imaging device according to the present embodiment includes the semiconductor substrate 51, the gate insulating film 52, the gate electrode 53, the photodiode 54, the charge transfer section 55, the interlayer insulating film 56, the light-shielding film 57, the contact 58, the insulating film 59, the intralayer lens 60, the planarization film 61, the reflecting wall 62, the color filter 63, the on-chip micro lens 64, and the insulating film 70. The component elements other than the insulating film 70 are identical to their counterparts in the first embodiment, and therefore any detailed descriptions thereof will be omitted.

The insulating film 70 is made of a material whose etching rate is higher than that of the insulating film 59. Note that, in the case where etching gas is CxFy gas and the insulating film 59 is made of silicon oxide or silicon oxynitride, the material of the insulating film 70 may be silicon nitride. Also, the reflecting wall 62 is formed so that its bottom face coincides with a bottom face of the insulating film 70.

Figure 6A:
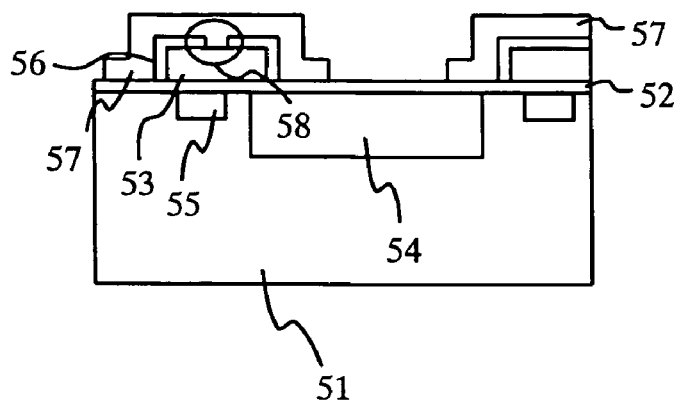
FIGS. 6A to 6F are cross section views of the solid-state imaging device at each step of a manufacturing process described in the second embodiment of the present invention.

With reference to the drawings, a manufacturing method of the above-described solid-state imaging device according to the present embodiment will be described below. FIGS. 6A to 6F are cross section views of the solid-state imaging device at each step of a manufacturing process described in the present embodiment. Note that, in the manufacturing process of the solid-state imaging device according to the present embodiment, steps prior to the step shown in FIG. 6A are identical to the steps shown in FIGS. 4A to 4E of the first embodiment. Thus, FIGS. 4A to 4E are utilized in the following descriptions.

First, the photodiodes 54 are formed on the semiconductor substrate 51 in a matrix form at regular spacings. Further, the charge transfer section 55 corresponding to the above-described photodiode 54 is formed next to the photodiode 54 so as to be away therefrom. Then, the gate insulating film 52, which is a silicon oxide film, is formed on the semiconductor substrate 51. As a result, the solid-state imaging device has a structure whose cross section is as shown in FIG. 4A. Note that the present step is identical to the first embodiment, and therefore detailed descriptions thereof will be omitted.

Next, as shown in FIG. 4B, on the gate insulating film 52, the polysilicon gate electrode 53 is formed immediately above the charge transfer section 55. Note that the present step is identical to the first embodiment, and therefore detailed descriptions thereof will be omitted.

After the gate electrode 53 is formed, the interlayer insulating film 56, which is a silicon oxide film, is formed so as to coat the gate electrode 53. After the interlayer insulating film 56 is formed, as shown in FIG. 4C, a resist is formed on the interlayer insulating film 56. Note that the present step is identical to the first embodiment, and therefore detailed descriptions thereof will be omitted.

Next, as shown in FIG. 4D, a contact hole used as the contact 58 is formed. Note that the present step is identical to the first embodiment, and therefore detailed descriptions thereof will be omitted.

Next, as shown in FIG. 4E, a metal (e.g., W) is deposited on the inside of the contact hole formed in FIG. 4D. Note that the present step is identical to the first embodiment, and therefore detailed descriptions thereof will be omitted.

After formation of the contact 58 is completed, as shown in FIG. 6A, the light-shielding film 57 is formed so as to coat the interlayer insulating film 56. Note that the present step is identical to the step shown in FIG. 4F of the first embodiment, and therefore detailed descriptions thereof will be omitted.

Figure 6B:
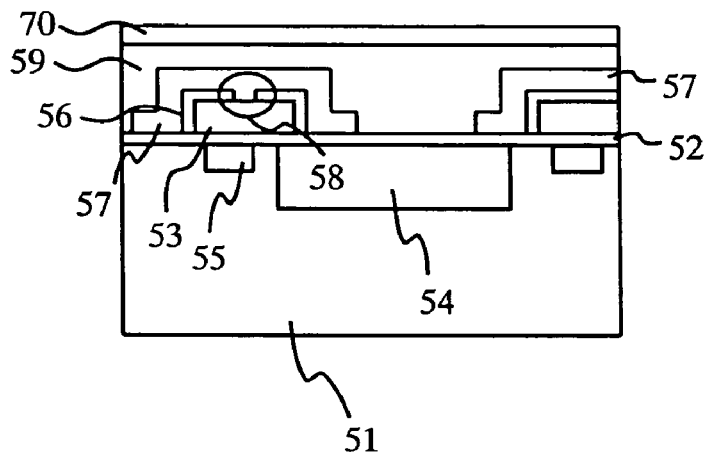

Next, a silicon oxide film or a silicon oxynitride film is deposited on the light-shielding film 57 and the aperture 65 by a CVD method. After formation of the insulating film 59, a silicon nitride film is deposited on the insulating film 59 by a CVD method. As a result, the insulating film 70 is formed, and the solid-state imaging device has a structure whose cross section is as shown in FIG. 6B.

Figure 6C:
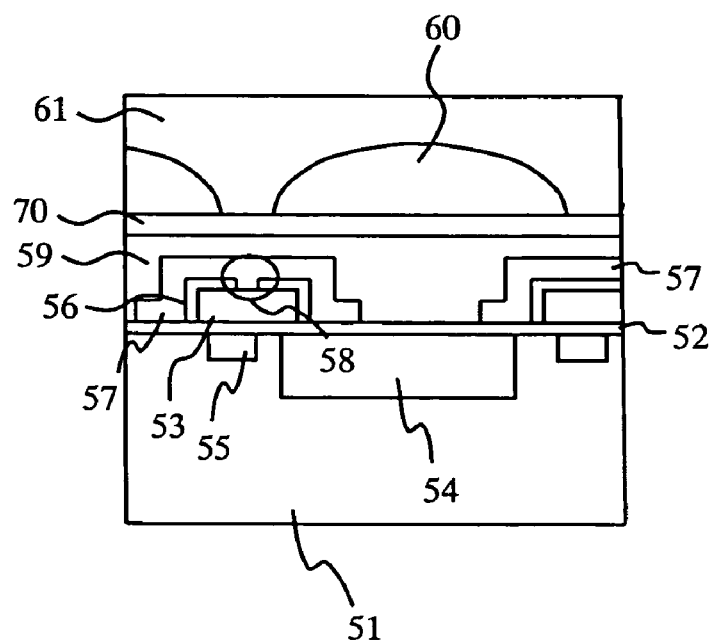

After formation of the insulating film 70 is completed, the intralayer lens 60 made of silicon nitride is formed in an area over the aperture 65. Further, the planarization film 61 is formed on the intralayer lens 60. As a result, the solid-state imaging device has a structure whose cross section is as shown in FIG. 6C. Note that the present step is identical to the step shown in FIG. 4H of the first embodiment, and therefore detailed descriptions thereof will be omitted.

Figure 6D:
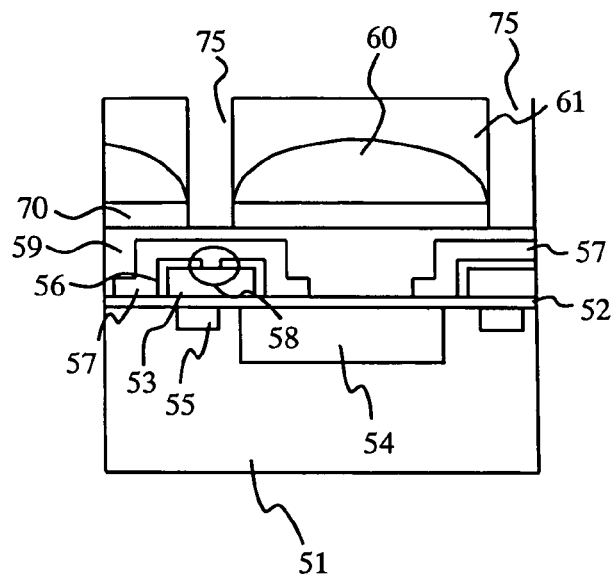

Next, a resist film with a grid pattern is formed on the planarization film 61 such that a trench, which will be described below, is formed between the apertures 65. Then, dry etching using CxFy gas is performed, thereby selectively removing the planarization film 61 and the insulating film 70 lying under the grid opening of the mask. As a result, as shown in FIG. 6D, the trench 75 is formed. An etching rate of the insulating film 59 is lower than that of the insulating film 70. As a result, when the trench 75 reaches the bottom of the insulating film 70, a formation speed of the trench 75 is slowed down. As a result, in the solid-state imaging device according to the present embodiment, the trench 75 does not reach the light-shielding film 57 even if a processing time is not controlled as precisely as in the first embodiment.

Figure 6E:
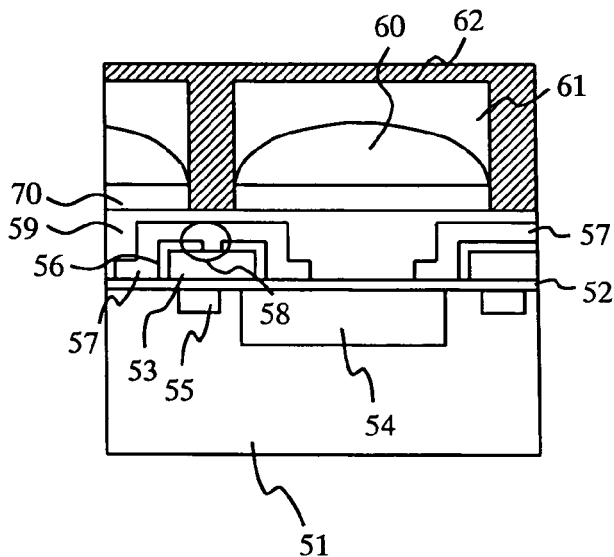
Figure 6F:
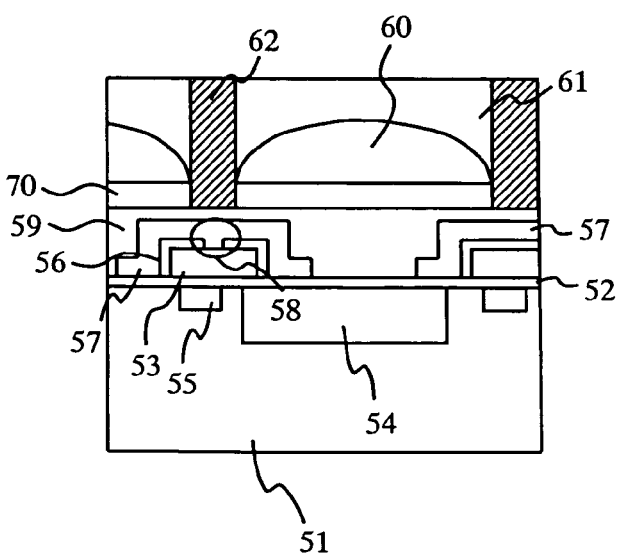

After formation of the trench 75, as shown in FIG. 6E, the W film 121 is deposited on the inside of the trench 75 by a PVD method or a CVD method. After deposition of the W film is completed, the excess W film 121 lying off the trench 75 is removed by a CMP method or an etch back process. As a result, as shown in FIG. 6F, the reflecting wall 62 is formed.

After formation of the reflecting wall 62 is completed, the color filter 63 is formed on the reflecting wall 62 and the planarization film 61. Finally, the on-chip micro lens 64 is formed on the color filter 63. Note that the present step is identical to the step shown in FIG. 4M of the first embodiment, and therefore detailed descriptions thereof will be omitted. As a result, the solid-state imaging device having the structure as shown in FIG. 5 is completed.

As such, based on the solid-state imaging device according to the present embodiment, as is the case with the first embodiment, it is possible to prevent a delay in an operation performed by the gate electrode. Also, it is possible to prevent oblique light from entering the photodiode.

Also, based on the solid-state imaging device according to the present embodiment, an insulating layer composed of two types of insulating films having different etching rates is deposited. Thus, when a trench used for formation of the reflecting wall is formed, it is possible to slow down the formation speed of the trench based on such a difference in the etching rate. As a result, it is possible to form a trench which does not reach the light-shielding film without performing precise processing time control.

Note that, in the present embodiment, it is assumed that an etching rate of the insulating film 70 is higher than an etching rate of the insulating film 59, but the present invention is not limited thereto. Specifically, a combination of etching gas and a material, by which the insulating film 70 can be etched but the insulating film 59 cannot be etched, may be used. Alternatively, a combination of etching gas and a material, by which formation of the trench is stopped when the trench reaches the upper surface of the insulating film 70, may be used.

Also, in the present embodiment, for the sake of simplification, it is assumed that the reflecting wall is formed as a W film. However, as is the case with the first embodiment, the reflecting wall may have a two-layer structure composed of W and Ti.

Third Embodiment

Figure 7:
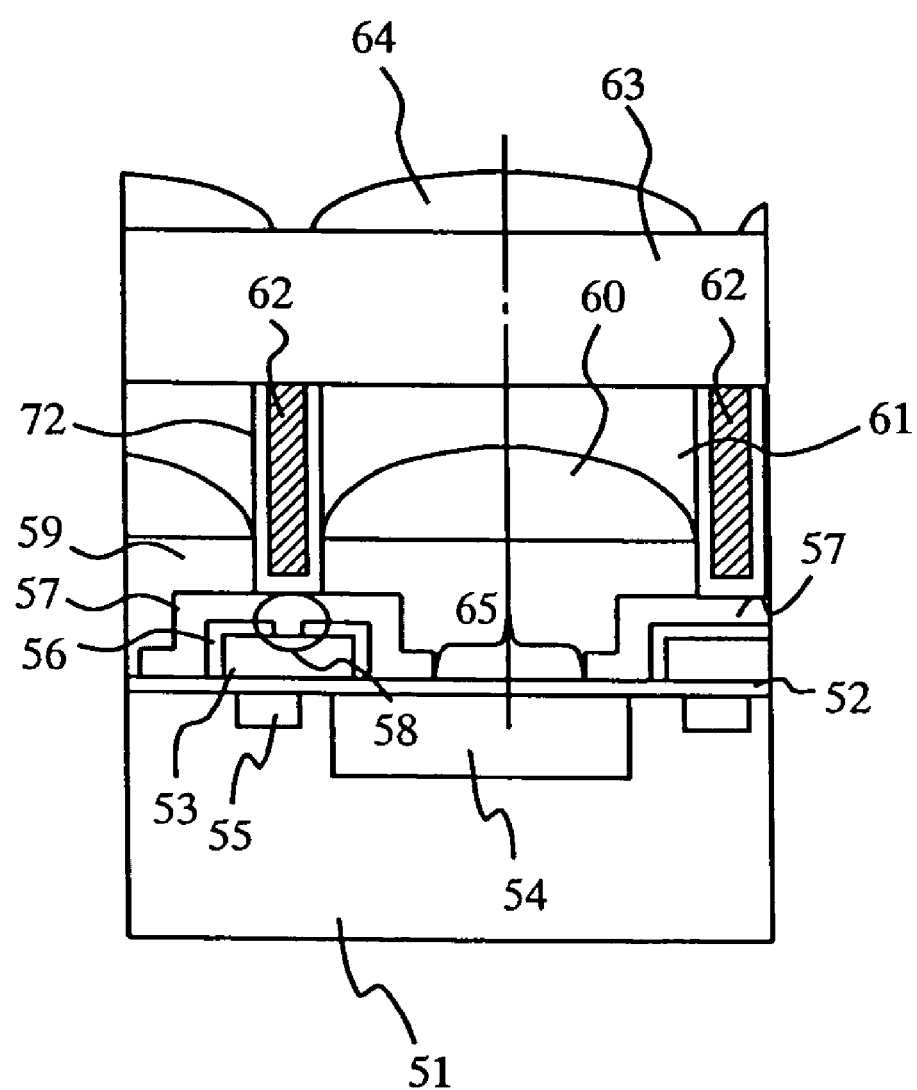
FIG. 7 is a cross section view of a solid-state imaging device according to a third embodiment of the present invention.

Hereinafter, with reference to the drawings, a solid-state imaging device according to a third embodiment of the present invention will be described. The solid-state imaging device according to the present embodiment differs from the solid-state imaging device according to the first embodiment only in that the reflecting wall 62 is formed by depositing a metal on the inside of a trench coated with an insulating film. FIG. 7 is a cross section view of one pixel of the solid-state imaging device according to the present embodiment.

First, a structure of the entirety of the solid-state imaging device according to the present embodiment is shown in FIG. 1, as is the case with the first embodiment, and therefore any detailed descriptions thereof will be omitted.

A pixel of the solid-state imaging device according to the present embodiment includes the semiconductor substrate 51, the gate insulating film 52, the gate electrode 53, the photodiode 54, the charge transfer section 55, the interlayer insulating film 56, the light-shielding film 57, the contact 58, the insulating film 59, the intralayer lens 60, the planarization film 61, the reflecting wall 62, the color filter 63, the on-chip micro lens 64, and the insulating film 72. The component elements other than the insulating film 72 are identical to their counterparts in the first embodiment, and therefore any detailed descriptions thereof will be omitted.

The insulating film 72, which is made of an optically transparent insulating material, functions as an insulator between the reflecting wall 62 and the light-shielding film 57. For example, silicon oxide or silicon nitride may be used as the insulating film 72. Note that the bottom of the insulating film 72 may or may not reach the upper surface of the light-shielding film 57.

With reference to the drawings, a manufacturing method of the above-described solid-state imaging device according to the present embodiment will be described below. FIGS. 8A to 8E are cross section views of the solid-state imaging device at each step of a manufacturing process described in the present embodiment. Note that, in the manufacturing process of the solid-state imaging device according to the present embodiment, steps prior to the step shown in FIG. 5 are identical to the steps shown in FIGS. 4A to 4G of the first embodiment. Thus, FIGS. 4A to 4G are utilized in the following descriptions.

First, the photodiodes 54 are formed on the semiconductor substrate 51 in a matrix form at regular spacings. Further, the charge transfer section 55 corresponding to the above-described photodiode 54 is formed next to the photodiode 54 so as to be away therefrom. Then, the gate insulating film 52, which is a silicon oxide film, is formed on the semiconductor substrate 51. As a result, the solid-state imaging device has a structure whose cross section is as shown in FIG. 4A. Note that the present step is identical to the first embodiment, and therefore detailed descriptions thereof will be omitted.

Next, as shown in FIG. 4B, on the gate insulating film 52, the polysilicon gate electrode 53 is formed immediately above the charge transfer section 55. Note that the present step is identical to the first embodiment, and therefore detailed descriptions thereof will be omitted.

After the gate electrode 53 is formed, the interlayer insulating film 56, which is a silicon oxide film, is formed so as to coat the gate electrode 53. After the interlayer insulating film 56 is formed, as shown in FIG. 4C, a resist is formed on the interlayer insulating film 56. Note that the present step is identical to the first embodiment, and therefore detailed descriptions thereof will be omitted.

Next, as shown in FIG. 4D, a contact hole used as the contact 58 is formed. Note that the present step is identical to the first embodiment, and therefore detailed descriptions thereof will be omitted.

Next, as shown in FIG. 4E, a metal (e.g., W) is deposited on the inside of the contact hole formed in FIG. 4D. Note that the present step is identical to the first embodiment, and therefore detailed descriptions thereof will be omitted.

After formation of the contact 58 is completed, as shown in FIG. 4F, the light-shielding film 57 is formed so as to coat the interlayer insulating film 56. Note that the present step is identical to the first embodiment, and therefore detailed descriptions thereof will be omitted.

Next, the insulating film 59 is formed on the light-shielding film 57 and the aperture 65. As a result, the solid-state imaging device has a structure whose cross section is as shown in FIG. 4G. Note that the present step is identical to the first embodiment, and therefore descriptions thereof will be omitted.

After formation of the insulating film 59 is completed, the intralayer lens 60 made of silicon nitride is formed in an area over the aperture 65. Further, the planarization film 61 is formed on the intralayer lens 60. As a result, the solid-state imaging device has a structure whose cross section is as shown in FIG. 4H. Note that the present step is identical to the step shown in the first embodiment, and therefore detailed descriptions thereof will be omitted.

Figure 8A:
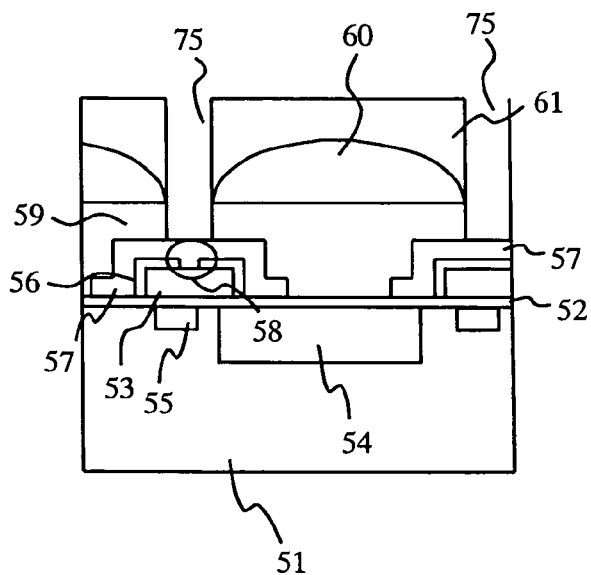
FIGS. 8A to 8E are cross section views of the solid-state imaging device at each step of a manufacturing process described in the third embodiment of the present invention.

Next, a resist film with a grid pattern is formed on the planarization film 61 such that a trench, which will be described below, is formed between the apertures 65. Then, dry etching using CxFy gas is performed, thereby selectively removing the planarization film 61 and the insulating film 59 lying under the grid opening of the mask. As a result, as shown in FIG. 8A, the trench 75 is formed. The bottom of the trench 75 may or may not reach the upper surface of the light-shielding film 57.

Figure 8B:
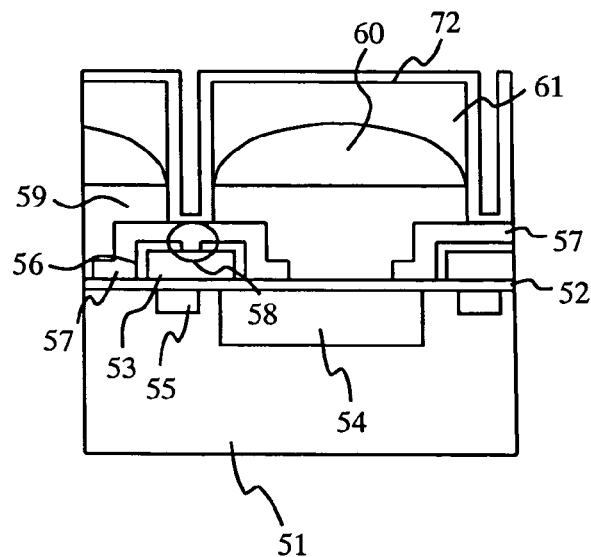

After formation of the trench 75 is completed, the insulating film 72 is formed as shown in FIG. 8B. Specifically, a silicon nitride film is deposited on the side and the bottom of the trench 75, and on the surface of the planarization film 61 by a CVD method.

Figure 8C:
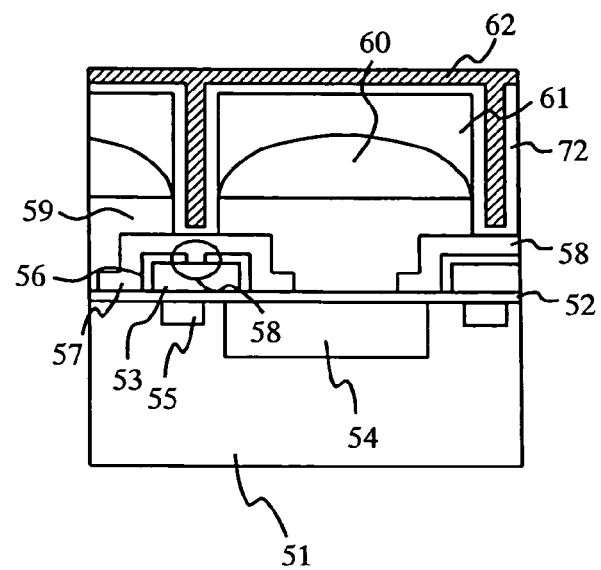
Figure 8D:
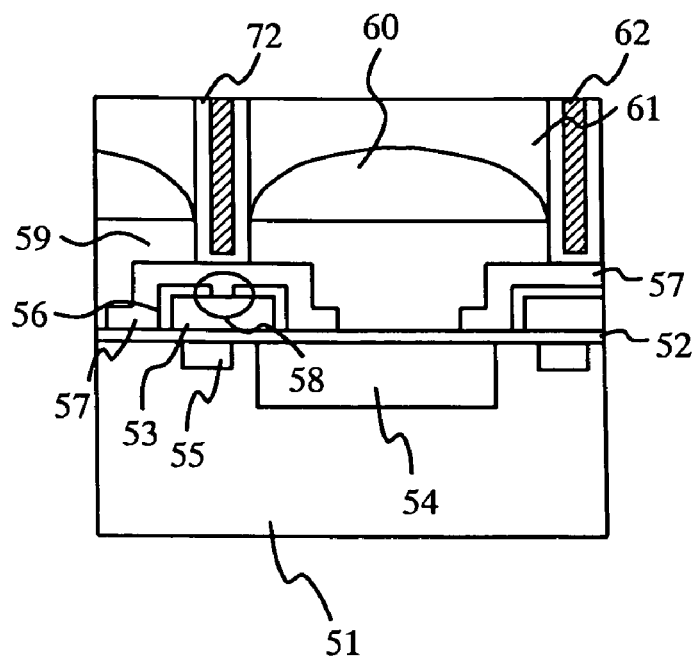

Next, as shown in FIG. 8C, the W film 121 is deposited so as to coat the insulating film 72 by a PVD or CVD method. After deposition of the W film is completed, the excess W film 121 and the insulating film 72 lying off the trench 75 are removed by a CMP method or an etch back process. As a result, as shown in FIG. 8D, the reflecting wall 62 is formed.

As described above, the reflecting wall 62 is formed after formation of the insulating film 72, not after formation of the trench 75, whereby an etching processing time does not need to be controlled as precisely as in the first embodiment, as it will be described below.

In the first embodiment, an etching condition such as a processing time, etc., needs to be controlled precisely when the trench 75 is formed so that the bottom of the trench 75 does not reach the upper surface of the light-shielding film 57. On the other hand, in the present embodiment, the insulating film 72 is formed between the reflecting wall 62 and the light-shielding film 57. Thus, even if the bottom of the trench 75 reaches the light-shielding film 57, there is no possibility that the light-shielding film 57 and the reflecting wall 62 are electrically connected to each other. Thus, during the formation of the trench 75, it is not necessary to pay attention to whether or not the bottom of the trench 75 reaches the upper surface of the light-shielding film 57. As a result, unlike the first embodiment, an etching processing time does not need to be controlled precisely during the formation of the trench 75.

Figure 8E:
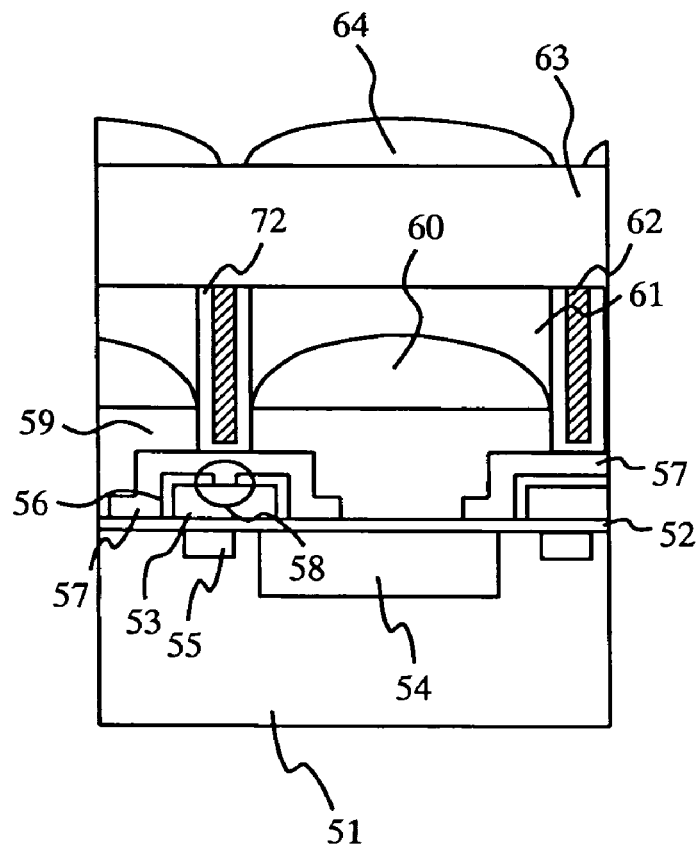

After formation of the reflecting wall 62 is completed, the color filter 63 is formed on the reflecting wall 62 and the planarization film 61. Finally, the on-chip micro lens 64 is formed on the color filter 63. Note that the present step is identical to the step shown in FIG. 4M of the first embodiment, and therefore detailed descriptions thereof will be omitted. As a result, the solid-state imaging device having the structure as shown in FIG. 8E is completed.

As such, based on the solid-state imaging device according to the present embodiment, as is the case with the first embodiment, it is possible to prevent a delay in an operation performed by the gate electrode. Also, it is possible to prevent oblique light from entering the photodiode.

Also, based on the solid-state imaging device according to the present embodiment, an insulating film is formed around the reflecting wall. Thus, even if a trench reaching the light-shielding film is formed, the reflecting wall and the light-shielding film are not electrically connected to each other. Thus, it is not necessary to pay attention to a depth of the trench 75 during the formation of the trench 75. As a result, it is possible to form a trench which does not reach the light-shielding film without performing a precise processing time control.

Also, in the present embodiment, for the sake of simplification, it is assumed that the reflecting wall is formed as a W film. However, as is the case with the first embodiment, the reflecting wall may have a two-layer structure composed of W and Ti.

Fourth Embodiment

Hereinafter, a solid-state imaging device according to a fourth embodiment of the present invention will be described. The solid-state imaging device according to the present embodiment is able to reduce variation in light sensitivity caused between a central area of a photoreceiving region, in which light-sensitive elements are formed, and its peripheral area.

Figure 9:
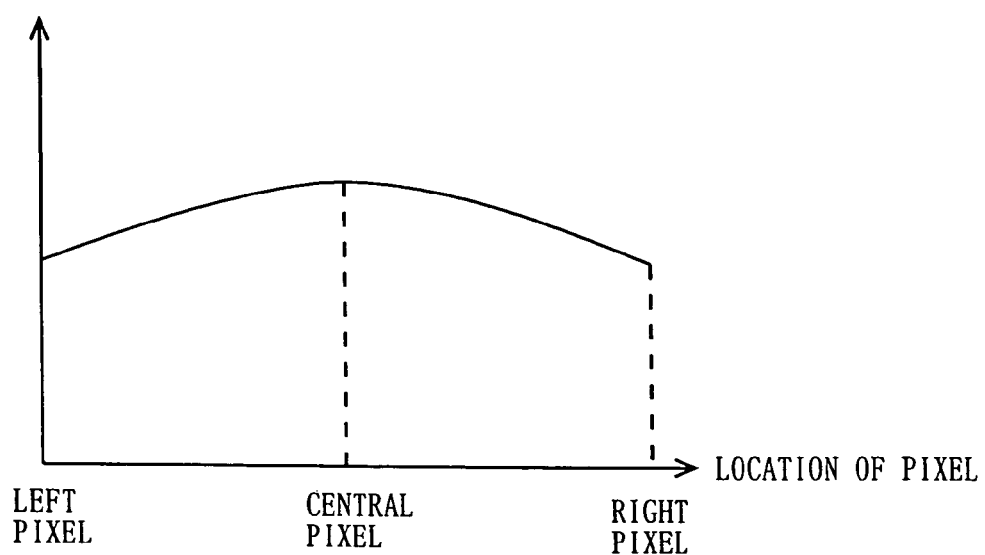
FIG. 9 is a graph showing a distribution of light sensitivity of a camera device with an optical lens and a built-in solid-state imaging device.

First, with reference to the drawings, variation in the light sensitivity caused between the central area of the photoreceiving region and its peripheral area will be described in detail. FIG. 9 is a graph showing a distribution of light sensitivity of a camera device with an optical lens and a built-in solid-state imaging device. Note that a vertical axis represents light sensitivity, and a horizontal axis represents a position of a pixel in the solid-state imaging device.

Figure 16:
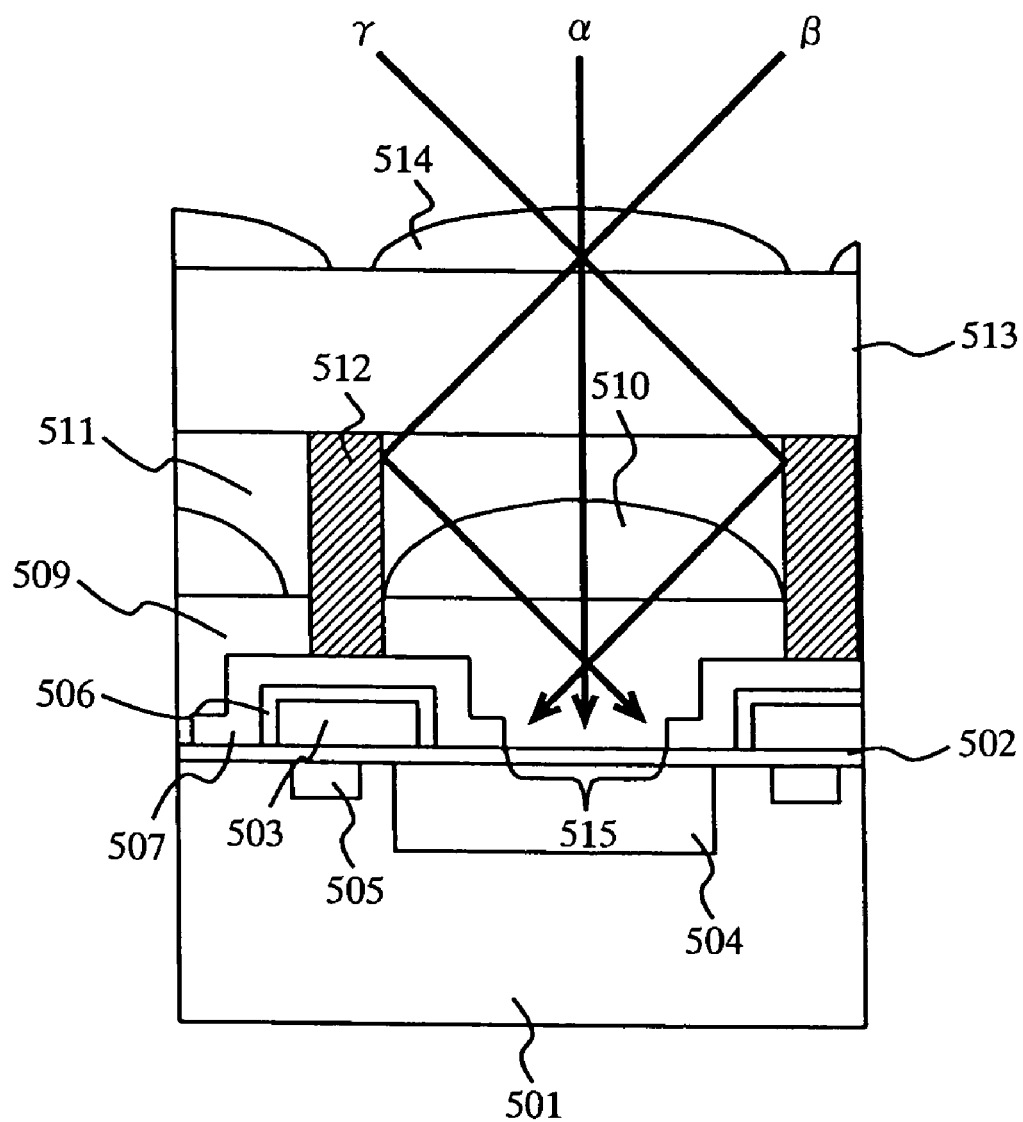
FIG. 16 is an illustration showing a cross section view of a conventional solid-state imaging device.
Figure 17:
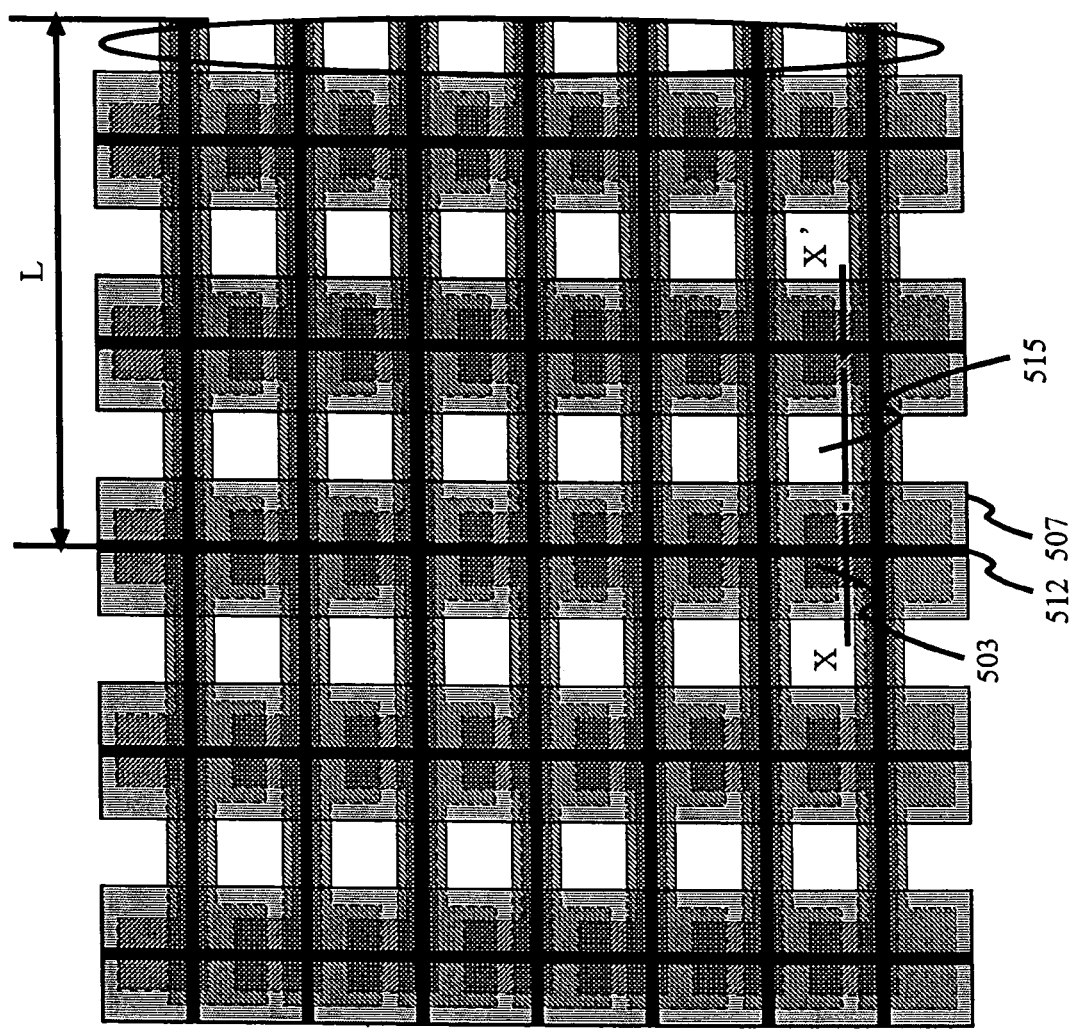
FIG. 17 is a top plan view of the conventional solid-state imaging device.
Figure 18:
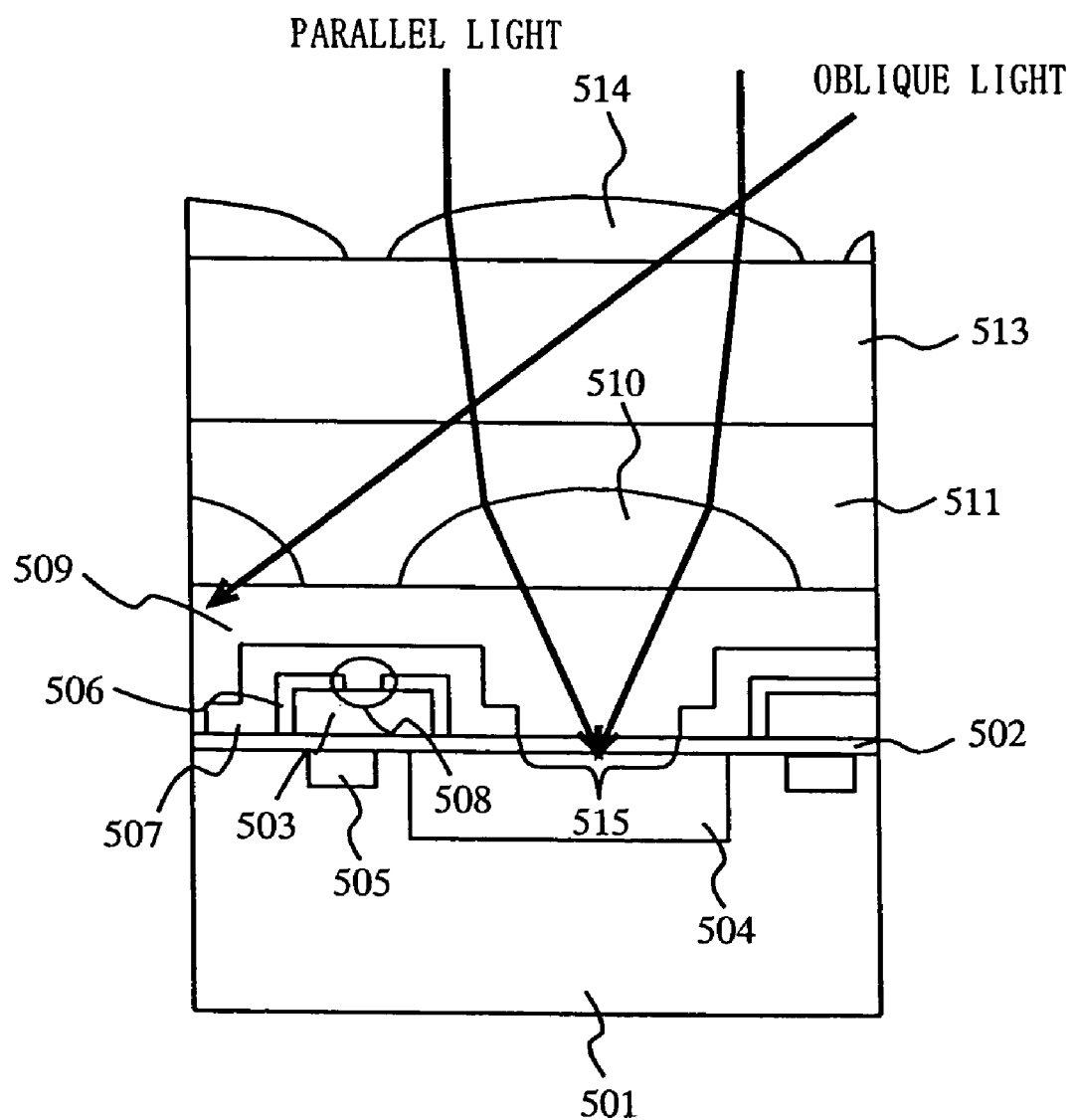
FIG. 18 is an illustration showing a cross section view of a conventional solid-state imaging device.
Figure 19:
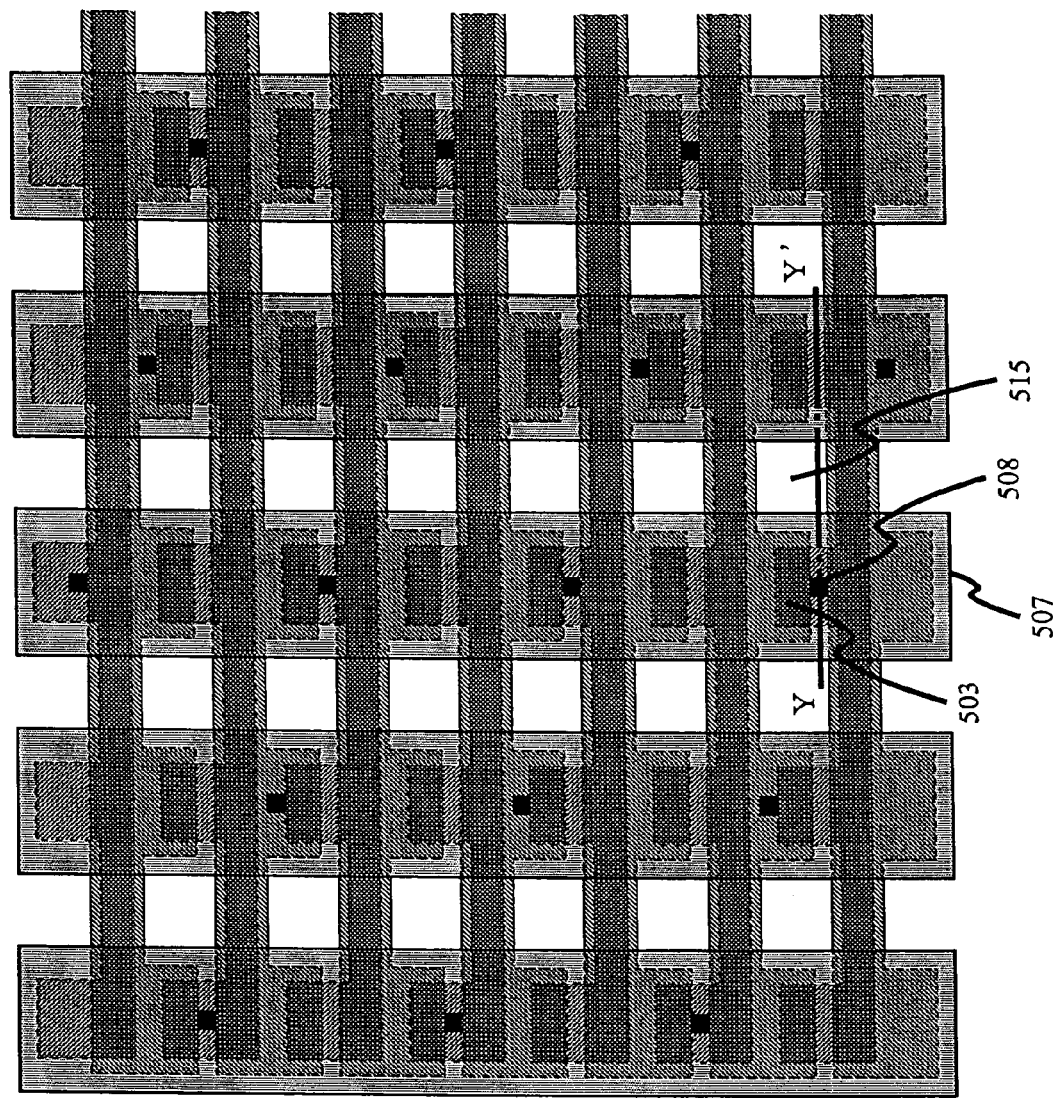
FIG. 19 is a top plan view of the conventional solid-state imaging device.

First, there is a certain relationship between a position of a pixel in the solid-state imaging device and an angle of incident light. Specifically, in a pixel lying near the center of the solid-state imaging device, a percentage of light incident from immediately above (light denoted as a in FIG. 16) is higher than a percentage of light having another incident angle. On the other hand, in a pixel lying in a right area of the solid-state imaging device, a percentage of oblique light incident from the left (light denoted as β in FIG. 16) is higher than a percentage of light having another incident angle. Also, in a pixel lying in a left area of the solid-state imaging device, a percentage of oblique light incident from the right (light denoted as γ in FIG. 16) is higher than a percentage of light having another incident angle.

The light incident from immediately above onto the solid-state imaging device is collected by the on-chip micro lens 514 and the intralayer lens 510, and enters the photodiode 504 with a high degree of efficiency. On the other hand, even if the oblique light is reflected by the reflecting wall 512, not all reflected light enters the photodiode 504, and a portion thereof is prevented from entering the photodiode 504 by the light-shielding film 507, for example. That is, the probability that the oblique light enters the photodiode 504 is lower than the probability that the light incident from immediately above enters the photodiode 504. As a result, the pixel in the right or left area with a higher percentage of oblique light has lower light sensitivity than the pixel in the central area with a lower percentage of oblique light. Specifically, as shown in FIG. 9, pixels located at the right and left edges of the solid-state imaging device have lower light sensitivity, and a pixel located at the center of the solid-state imaging device has higher light sensitivity.

Figure 10:
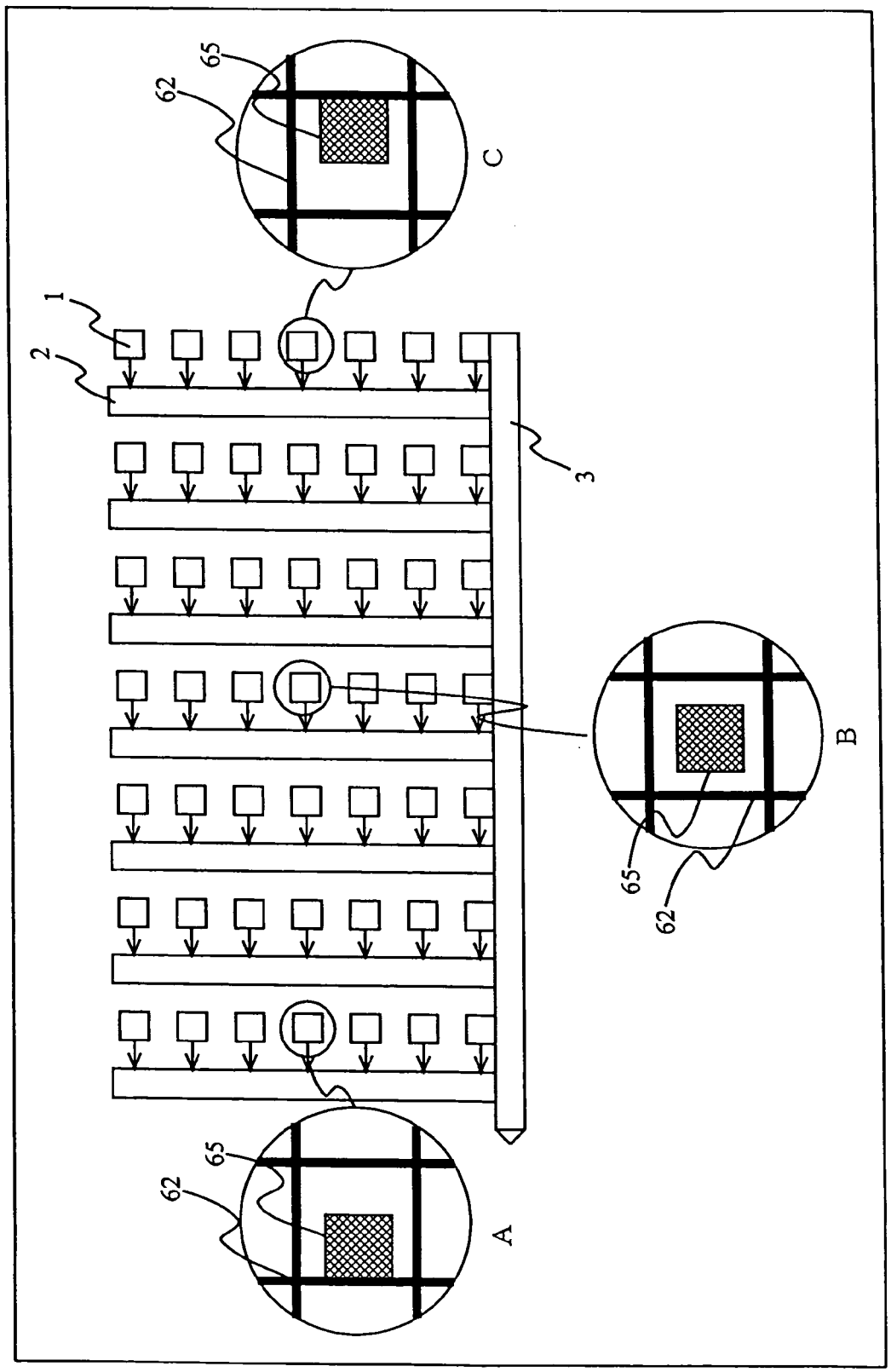
FIG. 10 is an illustration showing a structure of the entirety of a solid-state imaging device according to a fourth embodiment of the present invention.

Thus, in order to reduce variation in light sensitivity in the photoreceiving region, the solid-state imaging device according to the present embodiment changes spacing between the reflecting walls 512 in accordance with a distance from the center of the photoreceiving region to the reflecting wall 512, rather than arranging the reflecting walls 512 at regular spacings in a grid pattern. Also, the solid-state imaging device according to the present embodiment changes spacing between the intralayer lenses 510 and spacing between the on-chip micro lenses 514 in similar manners. Hereinafter, the solid-state imaging device according to the present embodiment will be described in detail with reference to the drawings. FIG. 10 is an illustration showing a structure of the entirety of the solid-state imaging device according to the present embodiment. FIGS. 11A to 11C are cross section views of pixels located at the left edge, at the center, and at the right edge, respectively, of the photoreceiving region of the solid-state imaging device as shown in FIG. 10.

As shown in FIG. 10, the solid-state imaging device according to the present embodiment includes the light receiving section 1, the vertical CCD shift resistor 2, and the horizontal CCD shift resistor 3. Note that the light receiving section 1, the vertical CCD shift resistor 2, and the horizontal CCD shift resistor 3 are identical to their counterparts in the first embodiment, and therefore descriptions thereof will be omitted. Note that encircled illustrations A to C in FIG. 10 are enlarged views of pixels located at the right edge of the photoreceiving region, at the center thereof, and at the left edge thereof, respectively.

Next, cross sections of the pixels as shown in the encircled illustrations A to C will be described in detail using the drawings. FIG. 11A is an illustration showing a cross section of a portion corresponding to the encircled illustration A of FIG. 10. FIG. 11B is an illustration showing a cross section of a portion corresponding to the encircled illustration B of FIG. 10. FIG. 11C is an illustration showing a cross section of a portion corresponding to the encircled illustration C of FIG. 10. As shown in FIG. 11, a pixel of the solid-state imaging device according to the present embodiment includes the semiconductor substrate 51, the gate insulating film 52, the gate electrode 53, the photodiode 54, the charge transfer section 55, the interlayer insulating film 56, the light-shielding film 57, the contact 58, the insulating film 59, the intralayer lens 60, the planarization film 61, the reflecting wall 62, the color filter 63, and the on-chip micro lens 64. Note that the semiconductor substrate 51, the gate insulating film 52, the gate electrode 53, the photodiode 54, the charge transfer section 55, the interlayer insulating film 56, the light-shielding film 57, the contact 58, the insulating film 59, the intralayer lens 60, the planarization film 61, the color filter 63, and the on-chip micro lens 64 are identical to their counterparts in the first embodiment, and therefore detailed descriptions thereof will be omitted. Hereinafter, the placement of the intralayer lens 60, the on-chip micro lens 64, and the reflecting wall 62, which is one feature of the present embodiment, will be described in detail. Note that the structure, etc., of the reflecting wall 62 is identical to its counterpart in the first embodiment, and therefore descriptions thereof will be omitted.

The reflecting wall 62 of the solid-state imaging device according to the present embodiment is formed so that a middle point between the reflecting walls opposing each other across the aperture 65 is displaced from the center of the aperture 65 toward the center of the photoreceiving region. Specifically, in the pixel located at the left edge of the photoreceiving region, the reflecting walls 62 are placed so as to be displaced in a right direction, as shown in the encircled illustration A of FIG. 10 and FIG. 11A. Also, in the pixel located at the right edge of the photoreceiving region, the reflecting walls 62 are placed so as to be displaced in a left direction, as shown in the encircled illustration C of FIG. 10 and FIG. 11C. Note that, in the pixel at the center of the photoreceiving region, a middle point between the reflecting walls 62 opposing each other coincides with the center of the aperture 65, as shown in the encircled illustration B of FIG. 10 and FIG. 11B. Also, in the pixel located at the upper edge of the photoreceiving region, the reflecting walls 62 are placed so as to be displaced in a lower direction. In the pixel located at the lower edge of the photoreceiving region, reflecting walls 62 are placed so as to be displaced in an upper direction.

Figure 12:
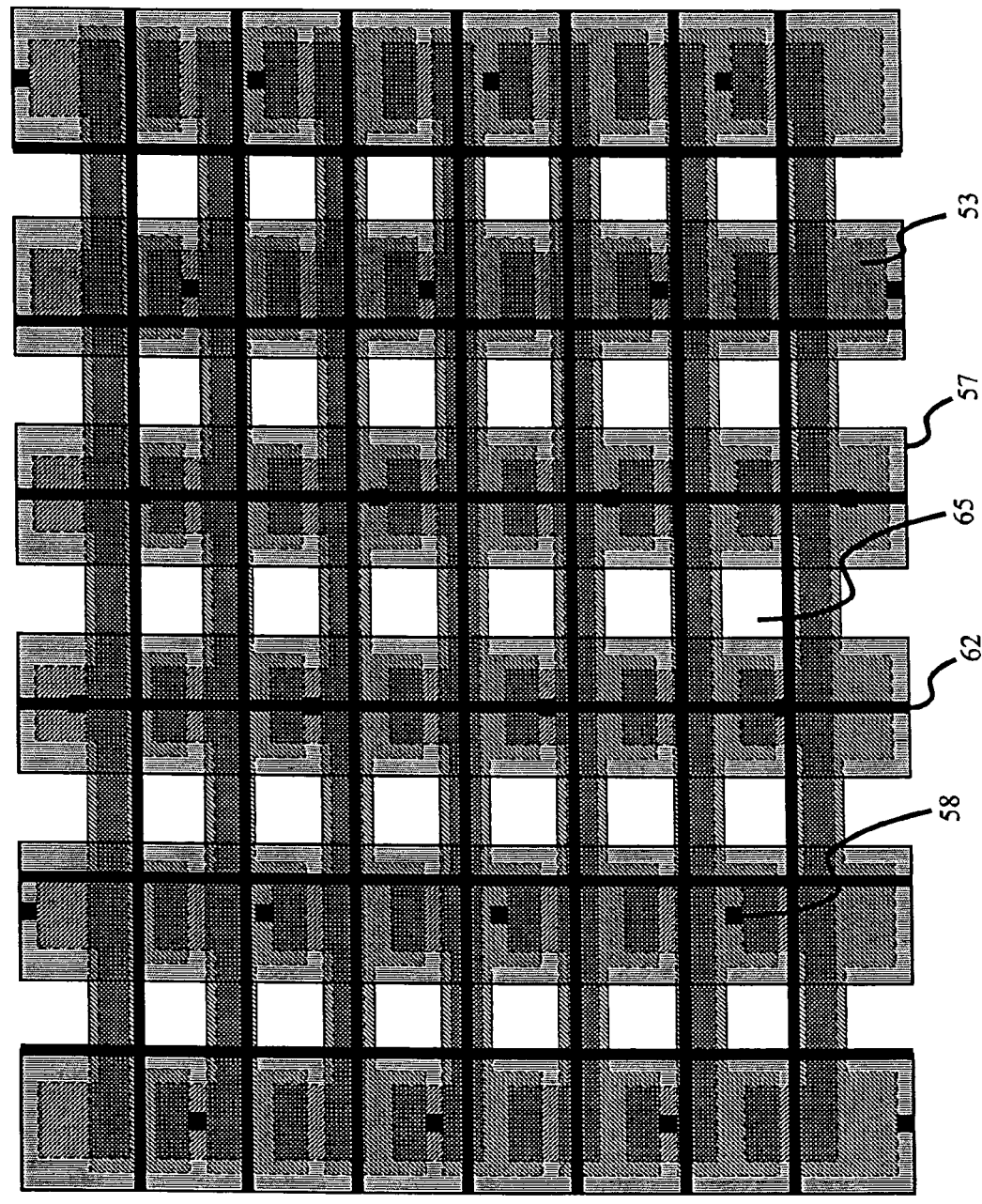
FIG. 12 is a top plan view of the solid-state imaging device according to the first embodiment of the present invention.

Here, the amount of the displacement of the reflecting walls 62 will be described using FIG. 12. FIG. 12 is an illustration showing a positional relationship between the aperture 65 and the reflecting wall 62. Note that, for the sake of simplification, assume that the photoreceiving region has a 5×6 matrix arrangement.

Figure 13A:
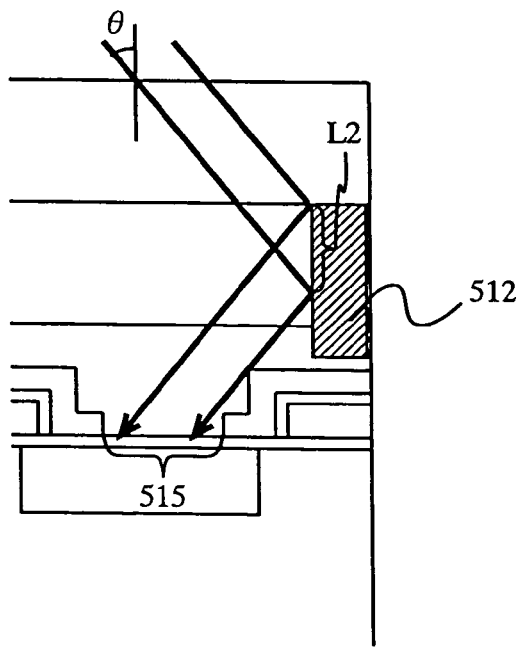
FIGS. 13A and 13B are illustrations showing a path of light entering the solid-state imaging device according to the first embodiment.
Figure 13B:
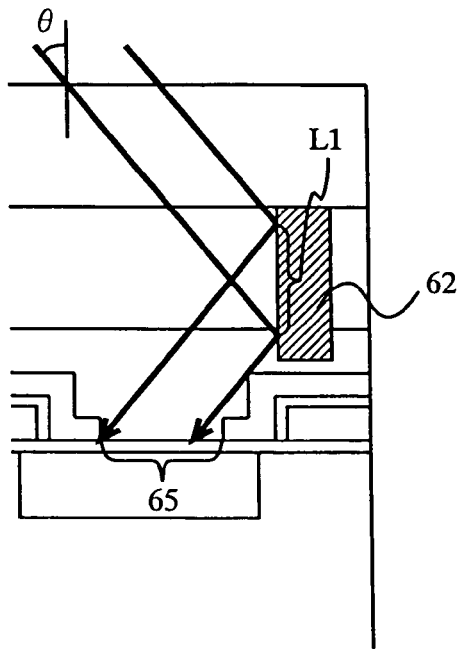

As shown in FIG. 12, the apertures 65 are arranged in a matrix form at regular spacings. Further, the reflecting walls 62 are formed over the light-shielding film 57 in a grid pattern. Also, the greater the distance from the center of the photoreceiving region becomes, the greater the amount of the displacement between a middle point of the center of the reflecting walls 62 opposing each other across the aperture 65 and the center of the aperture 65 becomes. As such, the further the aperture 65 is away from the center of the photoreceiving region, the further the reflecting wall 62 is displaced toward the center of the photoreceiving region relative to the aperture 65, whereby it is possible to efficiently collect incident light onto the photodiode 54 in a position away from the center of the photoreceiving region, which will be described below in detail with reference to the drawings. FIG. 13A is an illustration showing a cross section of a pixel located at the right edge of the photoreceiving region of the solid-state imaging device of the first embodiment. FIG. 13B is an illustration showing a cross section of a pixel located at the right edge of the photoreceiving region of the solid-state imaging device of the present embodiment. Note that, for the sake of simplification, the intralayer lens 60, etc., is omitted.

First, as described above, in a pixel located at the right edge of the photoreceiving region, a percentage of oblique light incident from the left is higher than a percentage of light having another incident angle. Thus, as shown in FIG. 13A, in the conventional solid-state imaging device, the oblique light entering the solid-state imaging device is reflected off the reflecting wall 512 and into the aperture 515.

However, as shown in FIG. 13A, the reflecting wall 512 is limited in height, whereby it is impossible to reflect the oblique light into the entire area of the aperture 515. Specifically, as shown in FIG. 13A, only the light reflected off a portion L2 of the reflecting wall 512 enters the aperture 515.

On the other hand, in the solid-state imaging device according to the present embodiment, the reflecting wall 62 of a pixel located at the right edge is displaced toward the left direction. Thus, as shown in FIG. 13B, it is possible to reflect the light having the same incident angle as the light shown in FIG. 13A by using a lower portion of the reflecting wall 62 compared to the solid-state imaging device of the first embodiment. Thus, the oblique light reflected off a portion L1 of the reflecting wall 62 enters the aperture. A comparison between FIG. 13A and FIG. 13B shows that L1>L2, whereby the amount of light entering the aperture 65 is increased compared to the solid-state imaging device according to the first embodiment. As a result, it is possible to improve the light sensitivity of the solid-state imaging device in an area other than the central area of the photoreceiving region, and it is possible to reduce a difference in the light sensitivity between the central area of the photoreceiving region of the solid-state imaging device and its peripheral area. Also, in the solid-state imaging device according to the present embodiment, it is possible to reflect the oblique light using the vicinity of the center of the reflecting wall 62, thereby efficiently collecting the oblique light having various incident angles onto the aperture.

A manufacturing method of the above-described solid-state imaging device will be briefly described. The manufacturing method of the solid-state imaging device according to the present embodiment is substantially the same as that of the solid-state imaging device according to the first embodiment. Therefore, only a step different from its counterpart in the first embodiment will be described below.

First, the steps as shown in FIGS. 4A to 4G are identical to their counterparts in the first embodiment, and therefore detailed descriptions thereof will be omitted.

In a step shown in FIG. 4G, after formation of the insulating film 59 is completed, the silicon nitride intralayer lens 60 is formed on the insulating film 59 over the aperture 65. The intralayer lens 60 is preferably formed in a position displaced from the center of the aperture 65 toward the center of the photoreceiving region.

Further, a silicon oxide film is deposited on the intralayer lens 60 by a CVD method. Then, a surface of the silicon oxide film is planarized by a CMP method, thereby forming the planarization film 61. As a result, the solid-state imaging device has a cross section as shown in FIG. 4H.

Next, a resist film with a grid pattern is formed on the planarization film 61 such that a trench, which will be described below, is formed between the apertures 65. The resist film with a grid pattern is formed so that a middle point of the grid openings opposing each other across each aperture 65 is displaced from the center of the aperture 65 toward the center of the photoreceiving region. Note that, the amount of the displacement between a middle point of the contacts 58 opposing each other across the aperture 65 and the center of the aperture 65 becomes greater as a pixel is positioned away from the center of the photoreceiving region.

Next, dry etching is performed using CxFy gas, thereby selectively removing the planarization film 61 and the insulating film 59 lying under the grid opening of the mask. As a result, as shown in FIG. 4I, the trench 75 is formed. The following steps performed in FIGS. 4J to 4L are identical to their counterparts in the first embodiment, and therefore descriptions thereof will be omitted.

In a step as shown in FIG. 4L, after formation of the reflecting wall 62 is completed, the color filter 63 is formed on the reflecting wall 62 and the planarization film 61. Specifically, a three-or four-layer film is deposited according to color coding by a dyeing method or color resist coating. Finally, the on-chip micro lens 64 is formed on the color filter 63. Specifically, the color filter 63 is coated with a hot-melt transparent resin, and a thermal reflow process is performed for a resist on the hot-melt transparent resin to form the on-chip micro lens 64. As a result, the solid-state imaging device having the structure as shown in FIG. 4M is completed. Note that the on-chip micro lens 64 is preferably formed in a position displaced from the center of the aperture 65 toward the center of the photoreceiving region.

As such, based on the solid-state imaging device according to the present embodiment, it is possible to prevent a delay in an operation performed by the gate electrode, and prevent oblique light from entering the photodiode, as is the case with the first embodiment.

Also, based on the solid-state imaging device according to the present embodiment, it is possible to reduce variation in light sensitivity caused between a central area of a photoreceiving region and its peripheral area. In the solid-state imaging device according to the present embodiment, it is possible to reflect the oblique light using the vicinity of the center of the reflecting wall, whereby it is possible to efficiently collect the oblique light having various incident angles onto the aperture.

Note that, in the solid-state imaging device according to the present embodiment, it is assumed that the amount of the displacement of the reflecting walls becomes greater as the reflecting wall is positioned away from the center of the photoreceiving region, but it is not limited thereto. For example, in the solid-state imaging device according to the present invention, in the case where the reflecting wall lies within a predetermined distance from the center of the photoreceiving region, the amount of displacement may be zero. In the case where the reflecting wall is positioned away by more than a predetermined distance from the center of the photoreceiving region, the amount of displacement may depend on the distance from the center of the photoreceiving region to the reflecting wall.

Also, the solid-state imaging device according to the first to fourth embodiments has been described based on the assumption that it is a CCD solid-state imaging device. However, the above-described solid-state imaging device may be a MOS solid-state imaging device.

Figure 14:
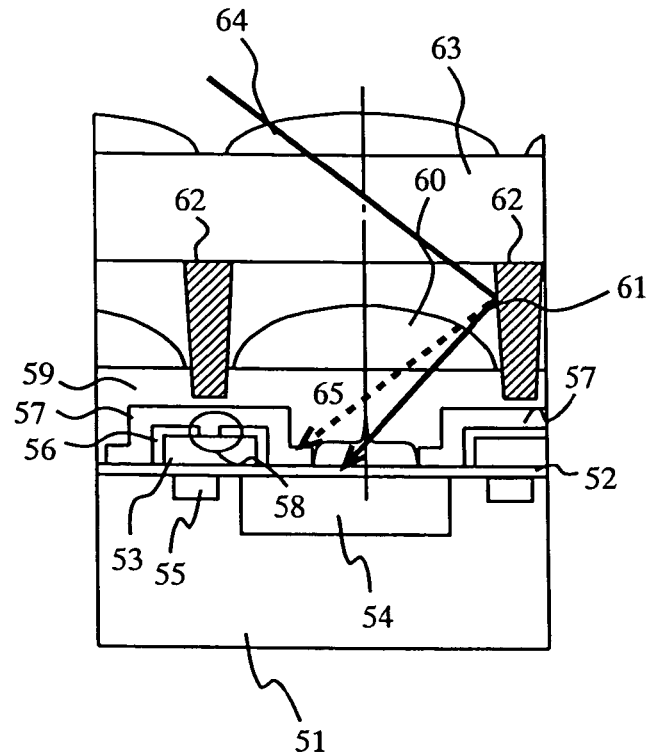
FIG. 14 is an illustration showing one example of another cross section view of the solid-state imaging device according to the first to fourth embodiments of the present invention.

Also, a cross section of the reflecting wall of the solid-state imaging device according to the first to fourth embodiments is rectangular as shown in FIG. 2, but it is not limited thereto. For example, as shown in FIG. 14, a cross section of the reflecting wall may be a trapezoid whose upper base is longer than the lower base. As a result, as shown in FIG. 14, it is possible to further efficiently collect the oblique light onto the aperture. Further, the bottom of the reflecting wall shown in FIG. 14 is narrower than the bottom of the reflecting wall shown in FIG. 2, whereby it is possible to substantially move the reflecting wall from side to side. As a result, design freedom of the solid-state imaging device is increased.

Also, in the first to fourth embodiments, it is assumed that the gate electrode has a one-layer film structure, but it is not limited thereto. For example, the gate electrode may have a multi-layer film structure by depositing polysilicon, a silicon oxide film, and polysilicon on the gate insulating film.

Also, in the first to fourth embodiments, the planarization film, which is formed on the intralayer lens, may be formed as a result of the following process: a resin such as SOG is applied, a thin film is deposited as a TEOS $SiO_2$/BPSG film or as a high density plasma $SiO_2$ CVD film, and planarization is performed by an etch back process or a CMP method. Also, the planarization film may be made of SiON in place of $SiO_2$.

Figure 15:
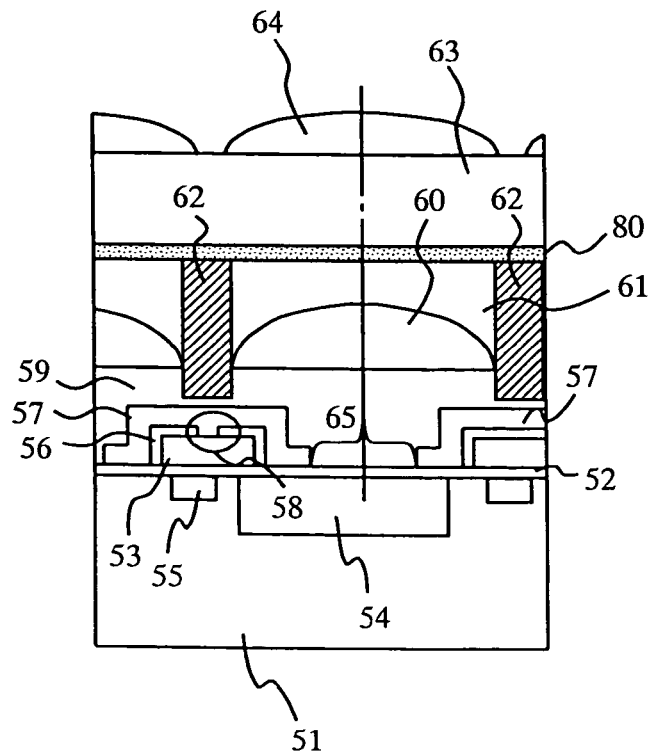
FIG. 15 is an illustration showing one example of still another cross section view of the solid-state imaging device according to the first to fourth embodiments of the present invention.

Also, in the solid-state imaging device according to the first to fourth embodiments, as shown in FIG. 15, an element planarization film 80 may be provided between the reflecting wall and the planarization film, and the color filter.

The solid-state imaging device according to the present invention has the effect of preventing the oblique light from entering the photodiode while preventing a delay in an operation performed by a gate electrode. Thus, the solid-state imaging device according to the present invention is useful as a solid-state imaging device in which a plurality of light-sensitive elements are arranged in a matrix form.

While the invention has been described in detail, the foregoing description is in all aspects illustrative and not restrictive. It is understood that numerous other modifications and variations can be devised without departing from the scope of the invention.

What is claimed is:

1. A solid-state imaging device comprising:
   a plurality of photodiodes provided on a semiconductor substrate;
   a plurality of electrodes for outputting an electrical charge generated in each of the plurality of photodiodes;
   a plurality of interconnections, which are connected to the plurality of electrodes, for applying a voltage to the plurality of electrodes;
   an insulating film provided above the plurality of interconnections and the plurality of photodiodes;
   a plurality of reflecting walls for reflecting light;
   a plurality of micro lenses provided above the plurality of reflecting walls such that the plurality of micro lenses respectively correspond to the plurality of photodiodes;
   a plurality of apertures which respectively correspond to the plurality of photodiodes so as to allow light to enter the respective photodiodes;
   a photoreceiving region including a plurality of pixels, each of which at least includes a photodiode, an electrode, a reflecting wall, a micro lens, and an aperture, arranged in a matrix form and
   a plurality of intralayer lenses provided on the insulating film such that the plurality of intralayer lenses respectively correspond to the plurality of photodiodes, wherein
   a middle point of the plurality of reflecting walls opposing each other across an aperture in a peripheral pixel within the photoreceiving region is displaced, by an amount of a first displacement, from a center of the aperture included in the same peripheral pixel toward the center of the photoreceiving region, and the greater the distance between the peripheral pixel within the photoreceiving region and the center of the photoreceiving region becomes, the greater the amount of the first displacement becomes,
   a center of a micro lens in a peripheral pixel within the photoreceiving region is displaced, by an amount of a second displacement, from a center of an aperture included in the same peripheral pixel toward the center of the photoreceiving region, and the greater the distance between the peripheral pixel within the photoreceiving region and the center of the photoreceiving region becomes, the greater the amount of the second displacement becomes, a center of an intralayer lens in a peripheral pixel within the photoreceiving region is displaced, by an amount of a third displacement, from a center of an aperture included in the same peripheral pixel toward a center of the photoreceiving region, the greater the distance between the peripheral pixel within the photoreceiving region and the center of the photoreceiving region becomes, the greater the amount of the third displacement becomes, and the amount of the first displacement is smaller than the amount of the second displacement.

2. The solid-state imaging device according to claim 1, wherein, for a same peripheral pixel, the amount of the first displacement and the amount of the third displacement is smaller than the amount of the second displacement.

3. The solid-state imaging device according to claim 1, wherein the reflecting wall is electrically insulated from the interconnection by the insulating film.

4. The solid-state imaging device according to claim 1, further comprising a color filter provided above the plurality of reflecting walls.

5. The solid-state imaging device according to claim 1, wherein each of the plurality of reflecting walls is a metal.

6. The solid-state imaging device according to claim 1, further comprising a second insulating film, which is provided between the plurality of reflecting walls, for flattening unevenness due to the plurality of intralayer lenses.

7. The solid-state imaging device according to claim 6, wherein the second insulating film is one of materials selected from a group of a SOG resin, $SiO_2$, and SiON.

8. The solid-state imaging device according to claim 1, wherein said solid-state imaging device is a MOS type solid-state imaging device.

* * * * *